(12) United States Patent
Wu

(10) Patent No.: US 12,414,434 B2
(45) Date of Patent: Sep. 9, 2025

(54) DISPLAY PANEL HAVING DIFFERENT OPENING LENGTHS AND LIGHT-EMITTING LENGTHS AND MANUFACTURING METHOD THEREFOR, AND DISPLAY DEVICE

(71) Applicant: BOE TECHNOLOGY GROUP CO., LTD., Beijing (CN)

(72) Inventor: Qixiao Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 601 days.

(21) Appl. No.: 17/788,960

(22) PCT Filed: Jun. 4, 2021

(86) PCT No.: PCT/CN2021/098401
§ 371 (c)(1),
(2) Date: Jun. 24, 2022

(87) PCT Pub. No.: WO2021/244643
PCT Pub. Date: Dec. 9, 2021

(65) Prior Publication Data
US 2023/0039372 A1 Feb. 9, 2023

(30) Foreign Application Priority Data

Jun. 4, 2020 (CN) .......................... 202010500167.X

(51) Int. Cl.
*H10K 50/86* (2023.01)
*H10K 50/844* (2023.01)
(Continued)

(52) U.S. Cl.
CPC ......... *H10K 50/865* (2023.02); *H10K 50/844* (2023.02); *H10K 50/858* (2023.02);
(Continued)

(58) Field of Classification Search
None
See application file for complete search history.

(56) References Cited

U.S. PATENT DOCUMENTS 9,312,311 B2 * 4/2016 Im .......................... H10K 71/18
2014/0168572 A1 * 6/2014 Iwata ....................... F21K 9/64
349/61

(Continued)

FOREIGN PATENT DOCUMENTS

CN 101997024 A 3/2011
CN 104508853 A 4/2015
(Continued)

OTHER PUBLICATIONS

Office Action for the Chinese Patent Application No. 202010500167.X issued by the Chinese Patent Office on Oct. 17, 2022.

*Primary Examiner* — Nduka E Ojeh
(74) *Attorney, Agent, or Firm* — XSENSUS LLP

(57) ABSTRACT

A display panel includes a substrate, at least two repeating units, and a light-shielding layer. Each repeating unit includes a plurality of sub-pixels including a first color sub-pixel and a second color sub-pixel. As a viewing angle increases, a luminance decay rate of the first color sub-pixel is greater than a luminance decay rate of the second color sub-pixel. The light-shielding layer includes a plurality of opening portions including first opening portions respectively corresponding to first color sub-pixels and second opening portions respectively corresponding to second color sub-pixels. Along a first direction, a difference between a length of a first opening portion and a length of a portion of the first color sub-pixel exposed from the first opening portion is greater than a difference between a length of a second opening portion and a length of a portion of the second color sub-pixel exposed from the second opening portion.

16 Claims, 10 Drawing Sheets

(51) Int. Cl.
*H10K 50/858* (2023.01)
*H10K 59/12* (2023.01)
*H10K 59/35* (2023.01)
*H10K 71/00* (2023.01)

(52) U.S. Cl.
CPC .......... *H10K 59/352* (2023.02); *H10K 71/00* (2023.02); *H10K 59/12* (2023.02); *H10K 59/1201* (2023.02)

(56) References Cited

U.S. PATENT DOCUMENTS

| | | | |
|---|---|---|---|
| 2015/0060906 A1* | 3/2015 | Asaki | H10K 59/352 |
| | | | 257/89 |
| 2018/0188590 A1* | 7/2018 | Gu | G02F 1/133504 |
| 2019/0341438 A1 | 11/2019 | Motoyama et al. | |
| 2020/0041099 A1* | 2/2020 | Fukuda | H10K 59/38 |
| 2020/0110303 A1 | 4/2020 | Lee et al. | |
| 2021/0066652 A1* | 3/2021 | Lee | H10K 50/844 |

FOREIGN PATENT DOCUMENTS

| | | |
|---|---|---|
| CN | 110212011 A | 9/2019 |
| CN | 110289295 A | 9/2019 |
| CN | 110531550 A | 12/2019 |
| CN | 110828526 A | 2/2020 |
| CN | 111009559 A | 4/2020 |
| CN | 111628104 A | 9/2020 |

* cited by examiner

DISPLAY PANEL HAVING DIFFERENT OPENING LENGTHS AND LIGHT-EMITTING LENGTHS AND MANUFACTURING METHOD THEREFOR, AND DISPLAY DEVICE

CROSS-REFERENCE TO RELATED APPLICATIONS

This application is a national phase entry under 35 USC 371 of International Patent Application No. PCT/CN2021/098401 filed on Jun. 4, 2021, which claims priority to Chinese Patent Application No. 202010500167.X, filed on Jun. 4, 2020, which are incorporated herein by reference in their entirety.

TECHNICAL FIELD

The present disclosure relates to the field of display technologies, and in particular, to a display panel and a manufacturing method therefor, and a display device.

BACKGROUND

Display devices can be classified into various types, such as a liquid crystal display (LCD) device, an inorganic electroluminescent display (ELD) device, an organic light-emitting diode (OLED) display device, a field emission display (FED) device according to display media and operation principles. Each type of display device may be applied to a variety of scenes to meet different image display requirements.

SUMMARY

In an aspect, a display panel is provided. The display panel includes a substrate, at least two repeating units disposed on the substrate and arranged in an array, and a light-shielding layer disposed on a side of the at least two repeating units away from the substrate. Each repeating unit includes a plurality of sub-pixels, and the plurality of sub-pixels include a first color sub-pixel and a second color sub-pixel. As a viewing angle increases, a luminance decay rate of the first color sub-pixel is greater than a luminance decay rate of the second color sub-pixel. The light-shielding layer includes a plurality of opening portions. In a thickness direction of the substrate, a sub-pixel in the plurality of sub-pixels corresponds to an opening portion in the plurality of opening portions, and the opening portion exposes at least one portion of the sub-pixel corresponding to the opening portion. The plurality of opening portions include first opening portions respectively corresponding to first color sub-pixels in the at least two repeating units, and second opening portions respectively corresponding to second color sub-pixels in the at least two repeating units. Along a first direction, a difference between a length of a first opening portion in the first opening portions corresponding to the first color sub-pixel and a length of a portion of the first color sub-pixel exposed from the first opening portion is greater than a difference between a length of a second opening portion in the second opening portions corresponding to the second color sub-pixel and a length of a portion of the second color sub-pixel exposed from the second opening portion. The first direction is a horizontal direction or a vertical direction.

In some embodiments, a ratio of a first opening length to a first light-emitting length is greater than a ratio of a second opening length to a second light-emitting length. The first opening length is the length of the first opening portion along the first direction, and the first light-emitting length is the length of the portion of the first color sub-pixel exposed from the first opening portion along the first direction. The second opening length is the length of the second opening portion along the first direction, and the second light-emitting length is the length of the portion of the second color sub-pixel exposed from the second opening portion along the first direction.

In some embodiments, along a second direction, a difference between a length of the first opening portion and a length of the portion of the first color sub-pixel exposed from the first opening portion is greater than a difference between a length of the second opening portion and a length of the portion of the second color sub-pixel exposed from the second opening portion. The second direction is perpendicular to the first direction.

In some embodiments, a ratio of a third opening length to a third light-emitting length is greater than a ratio of a fourth opening length to a fourth light-emitting length. The third opening length is the length of the first opening portion along the second direction, and the third light-emitting length is the length of the portion of the first color sub-pixel exposed from the first opening portion along the second direction. The fourth opening length is the length of the second opening portion along the second direction, and the fourth light-emitting length is the length of the portion of the second color sub-pixel exposed from the second opening portion along the second direction.

In some embodiments, the plurality of sub-pixels further include a third color sub-pixel. A luminance decay rate of the third color sub-pixel is less than the luminance decay rate of the first color sub-pixel, and is greater than the luminance decay rate of the second color sub-pixel. The plurality of opening portions further include third opening portions respectively corresponding to third color sub-pixels in the at least two repeating units. Along the first direction, a difference between a length of a third opening portion in the third opening portions corresponding to the third color sub-pixel and a length of a portion of the third color sub-pixel exposed from the third opening portion is less than the difference between the length of the first opening portion and the length of the portion of the first color sub-pixel exposed from the first opening portion, and is greater than the difference between the length of the second opening portion and the length of the portion of the second color sub-pixel exposed from the second opening portion.

In some embodiments, a ratio of a fifth opening length to a fifth light-emitting length is less than a ratio of a first opening length to a first light-emitting length, and is greater than a ratio of a second opening length to a second light-emitting length. The first opening length is the length of the first opening portion along the first direction, and the first light-emitting length is the length of the portion of the first color sub-pixel exposed from the first opening portion along the first direction. The second opening length is the length of the second opening portion along the first direction, and the second light-emitting length is the length of the portion of the second color sub-pixel exposed from the second opening portion along the first direction. The fifth opening length is the length of the third opening portion along the first direction, and the fifth light-emitting length F5 is the length of the portion of the third color sub-pixel exposed from the third opening portion along the first direction.

In some embodiments, a ratio of a sixth opening length to a sixth light-emitting length is less than the ratio of the third opening length to the third light-emitting length, and is greater than the ratio of the fourth opening length K4 to the fourth light-emitting length. The third opening length is the length of the first opening portion along the second direction, and the third light-emitting length is the length of the portion of the first color sub-pixel exposed from the first opening portion along the second direction. The fourth opening length is the length of the second opening portion along the second direction, and the fourth light-emitting length is the length of the portion of the second color sub-pixel exposed from the second opening portion along the second direction. The sixth opening length is a length of the third opening portion along the second direction, and the sixth light-emitting length is a length of the portion of the third color sub-pixel exposed from the third opening portion along the second direction. The second direction is perpendicular to the first direction.

In some embodiments, an orthographic projection of the sub-pixel on the substrate is located within an orthogonal projection of the opening portion corresponding to the sub-pixel on the substrate.

In some embodiments, a boundary of the orthogonal projection of the opening portion on the substrate and a boundary of the orthographic projection of the sub-pixel on the substrate have a loop-shaped gap therebetween.

In some embodiments, the boundary of the orthographic projection of the sub-pixel on the substrate has a first edge and a second edge that are parallel to each other. The loop-shaped gap includes a first sub-gap and a second sub-gap. The first sub-gap is a gap between the first edge and a corresponding edge of the boundary of the orthogonal projection of the opening portion on the substrate. The second sub-gap is a gap between the second edge and a corresponding edge of the boundary of the orthogonal projection of the opening portion on the substrate. The first sub-gap and the second sub-gap have a same width at all positions.

In some embodiments, the light-shielding layer is made of a light-absorbing material having a thickness D1, and D1 is greater than or equal to 0.1 µm and less than or equal to 1.5 µm; or the light-shielding layer is made of a metal material having a thickness D2, and D2 is greater than or equal to 10 nm and less than or equal to 1000 nm.

In some embodiments, the light-shielding layer further includes transparent patterns that are respectively filled in the plurality of opening portions.

In some embodiments, each sub-pixel includes a light-emitting portion.

In some embodiments, the display panel further includes an encapsulation layer. The light-shielding layer is disposed on a side of the encapsulation layer away from the substrate.

In some embodiments, the encapsulation layer includes a first encapsulation film, a second encapsulation film, and a third encapsulation film disposed between the first encapsulation film and the second encapsulation film. A thickness of the third encapsulation film is greater than a thickness of each of the first encapsulation film and the second encapsulation film.

In some embodiments, the thickness of the third encapsulation film is in a range of 6 µm to 12 µm, and a refractive index of the third encapsulation film is in a range of 1.45 to 1.65.

In another aspect, a display device is provided, and the display device includes the display panel in any one of the above embodiments.

In yet another aspect, a manufacturing method of a display panel is provided. The manufacturing method includes: providing at least two repeating units arranged in an array on a substrate; and providing a light-shielding layer on a side of the at least two repeating units away from the substrate. Each repeating unit includes a plurality of sub-pixels, and the plurality of sub-pixels include a first color sub-pixel and a second color sub-pixel. As a viewing angle increases, a luminance decay rate of the first color sub-pixel is greater than a luminance decay rate of the second color sub-pixel. The light-shielding layer includes a plurality of opening portions. In a thickness direction of the substrate, a sub-pixel in the plurality of sub-pixels corresponds to an opening portion in the plurality of opening portions, and the opening portion exposes at least one portion of the sub-pixel corresponding to the opening portion. The plurality of opening portions include first opening portions respectively corresponding to first color sub-pixels in the at least two repeating units, and second opening portions respectively corresponding to second color sub-pixels in the at least two repeating units. Along a first direction, a difference between a length of a first opening portion in the first opening portions corresponding to the first color sub-pixel and a length of a portion of the first color sub-pixel exposed from the first opening portion is greater than a difference between a length of a second opening portion in the second opening portions corresponding to the second color sub-pixel and a length of a portion of the second color sub-pixel exposed from the second opening portion. The first direction is a horizontal direction or a vertical direction.

In some embodiments, providing the light-shielding layer on the side of the at least two repeating units away from the substrate, includes: forming the light-shielding layer on the side of the at least two repeating units away from the substrate through magnetron sputter.

BRIEF DESCRIPTION OF THE DRAWINGS

In order to describe technical solutions in embodiments of the present disclosure or in the prior art more clearly, accompanying drawings to be used in the embodiments or in the prior art will be introduced briefly below. Obviously, the accompanying drawings to be described below are merely accompanying drawings of some embodiments of the present disclosure, and a person of ordinary skill in the art may obtain other drawings according to these drawings without inventive effort.

DETAILED DESCRIPTION

Figure 1:
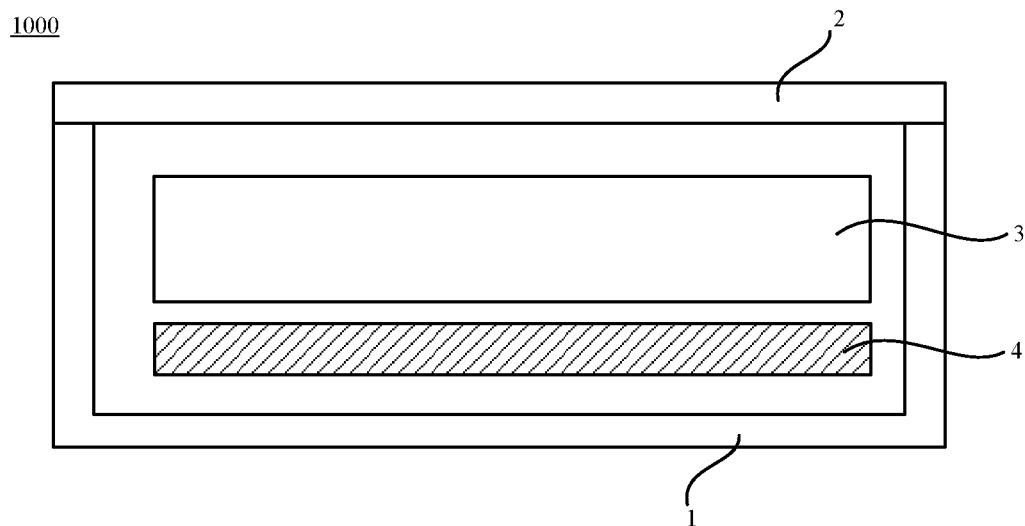
FIG. 1 is a structural diagram of a display device, in accordance with embodiments of the present disclosure.

Technical solutions in some embodiments of the present disclosure will be described clearly and completely below with reference to the accompanying drawings. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as an open and inclusive meaning, i.e., "including, but not limited to." In the description of the specification, the terms such as "one embodiment," "some embodiments," "exemplary embodiments," "an example," "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are only used for descriptive purposes, and are not to be construed as indicating or implying relative importance or implicitly indicating the number of indicated technical features. Thus, a feature defined with "first" or "second" may explicitly or implicitly include one or more of the features. In the description of the embodiments of the present disclosure, the term "a plurality of/the plurality of" means two or more unless otherwise specified.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

As used herein, the term "if" is, optionally, construed to mean "when" or "in a case where" or "in response to determining" or "in response to detecting", depending on the context. Similarly, the phrase "if it is determined" or "if [a stated condition or event] is detected" is, optionally, construed to mean "in a case where it is determined" or "in response to determining" or "in a case where [the stated condition or event] is detected" or "in response to detecting [the stated condition or event]", depending on the context.

The use of the phase "applicable to" or "configured to" herein means an open and inclusive expression, which does not exclude devices that are applicable to or configured to perform additional tasks or steps.

In addition, the use of the phase "based on" means openness and inclusiveness, since a process, step, calculation or other action that is "based on" one or more stated conditions or values may, in practice, be based on additional conditions or values exceeding those stated.

As used herein, the term such as "about," "substantially" or "approximately" includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

As used herein, the term such as "parallel," "perpendicular" or "equal" describes a stated condition and condition(s) similar to the stated condition. The similar condition(s) are within an acceptable range of deviation as determined by a person of ordinary skill in the art, considering measurement in question and errors associated with measurement of a particular quantity (i.e., limitations of a measurement system). For example, the term "parallel" includes absolutely parallel and approximately parallel, and for approximately parallel, an acceptable range of deviation may be, for example, within 5°. The term "perpendicular" includes absolutely perpendicular and approximately perpendicular, and for approximately perpendicular, an acceptable range of deviation may also be, for example, within 5°. The term "equal" includes absolutely equal and approximately equal, and for approximately equal, an acceptable range of deviation may be that, for example, a difference between two that are equal to each other is less than or equal to 5% of any one of the two.

Exemplary embodiments are described herein with reference to sectional views and/or plan views as idealized exemplary drawings. In the accompanying drawings, thicknesses of layers and sizes of regions are enlarged for clarity. Thus, variations in shape relative to the accompanying drawings due to, for example, manufacturing techniques and/or tolerances may be envisaged. Therefore, the exemplary embodiments should not be construed to be limited to the shapes of regions shown herein, but to include deviations in shape due to, for example, manufacturing. For example, an etched region shown in a rectangular shape generally has a curved feature. Therefore, the regions shown in the accompanying drawings are schematic in nature, and their shapes are not intended to show actual shapes of the regions in a device, and are not intended to limit the scope of the exemplary embodiments.

At present, organic light-emitting diodes are widely used in the field of display technologies due to advantages of self-luminescence, low power consumption, wide color gamut and flexible display.

A display panel in which organic light-emitting diodes are used as light-emitting devices is an organic electroluminescent display panel. A structure of a sub-pixel in the organic electroluminescent display panel is a laminated structure of an anode, an organic light-emitting material and a cathode. Since organic light-emitting materials in different sub-pixels emit light of different colors, different sub-pixels emit light of different colors. The light emitted from the sub-pixels of different colors is combined to realize image display (white light display). However, due to different characteristics of the organic light-emitting materials and different microcavity environments where the organic light-emitting materials are respectively located, the organic electroluminescent display panel displays a white image in front view, and at a large viewing angle, a degree of a variation in a luminance of a different sub-pixel with a viewing angle is inconsistent, which results in a color shift of the organic electroluminescent display panel at a large viewing angle, and affects the quality of the light-emitting device.

In order to solve the above problem, some embodiments of the present disclosure provide a display device. For example, the display device may be any product or component with a display function, such as a display, a television, a digital camera, a mobile phone, a tablet computer, a digital photo frame or a navigator, which is not limited in the embodiments of the present disclosure.

In some embodiments of the present disclosure, the display device includes a display panel. For example, the display panel may be an organic light-emitting diode (OLED) panel, a quantum dot light-emitting diode (QLED) panel, a liquid crystal display (LCD) panel, or a micro light-emitting diode (LED) panel (including a Mini LED panel or a Micro LED panel).

Hereinafter, a specific structure of the display panel will be described in an example where the display device includes the OLED display panel.

For example, referring to FIG. 1, a main structure of the display device 1000 includes a frame 1, a cover plate 2, the display panel 3, a circuit board 4 and other accessories. Here, the display panel 3 may be a flexible display panel or a rigid display panel. In a case where the display panel 3 is the flexible display panel, the display device is a flexible display device.

A longitudinal section of the frame 1 is U-shaped. The display panel 3, the circuit board 4 and other accessories are all disposed in the frame 1. The circuit board 4 is disposed below the display panel 3 (i.e., disposed on a back surface of the display panel 3, which is a surface facing away from a display surface of the display panel 3). The cover plate 2 is disposed on a side of the display panel 3 away from the circuit board 4.

It will be noted that the circuit board 4 is electrically connected to the display panel 3. The circuit board 4 generally includes a flexible printed circuit (FPC), a driving chip (also called integrated circuit, IC), a printed circuit board (PCB) and a connection substrate. The circuit board 4 functions to supply information about various display images to the display panel 3 after being powered on.

Figure 2:
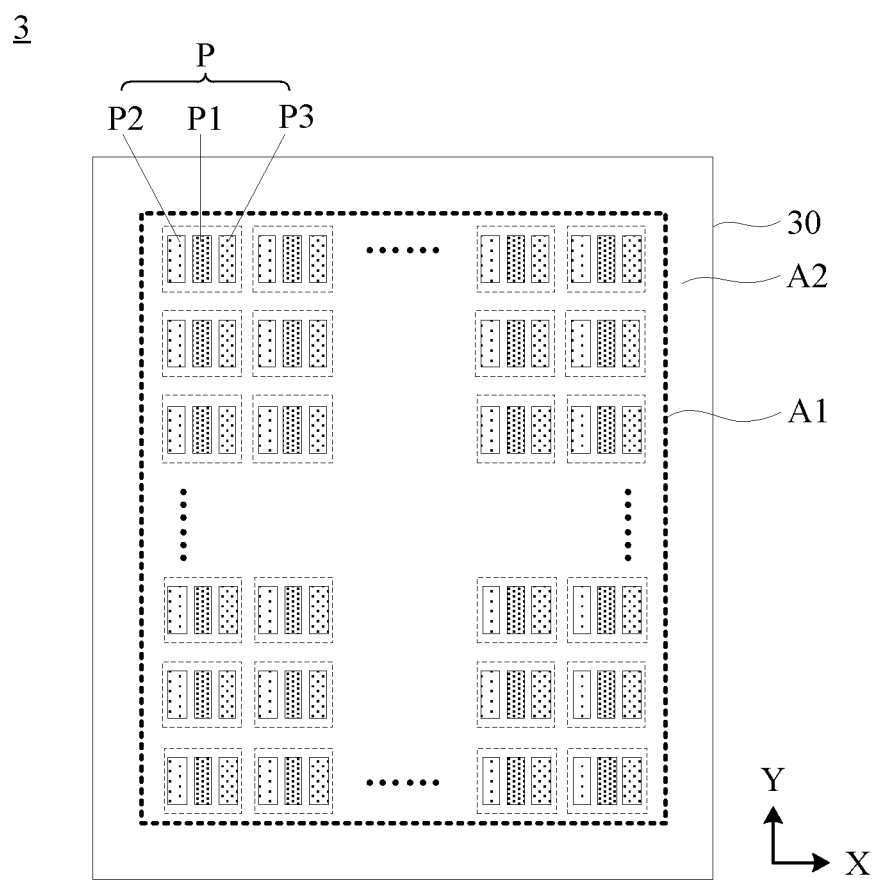
FIG. 2 is a diagram showing a region division of a display panel, in accordance with embodiments of the present disclosure.

As shown in FIG. 2, the display panel 3 is divided into a display region A1 (also called active area, AA) and a peripheral region A2 located on at least one side of the display region A1. FIG. 2 exemplarily illustrates that the peripheral region A2 surrounds the display region A1. The display region A1 includes a plurality of sub-pixels P. The peripheral region A2 is used for wiring. In addition, a gate driving circuit may be provided in the peripheral region A2. In a case where the display panel is the LCD display panel, an outline of a sub-pixel is determined by an opening in a black matrix. In a case where the display panel is the OLED display panel, the QLED display panel or the micro LED display panel, an outline of a sub-pixel is determined by a light-emitting portion.

Figure 3:
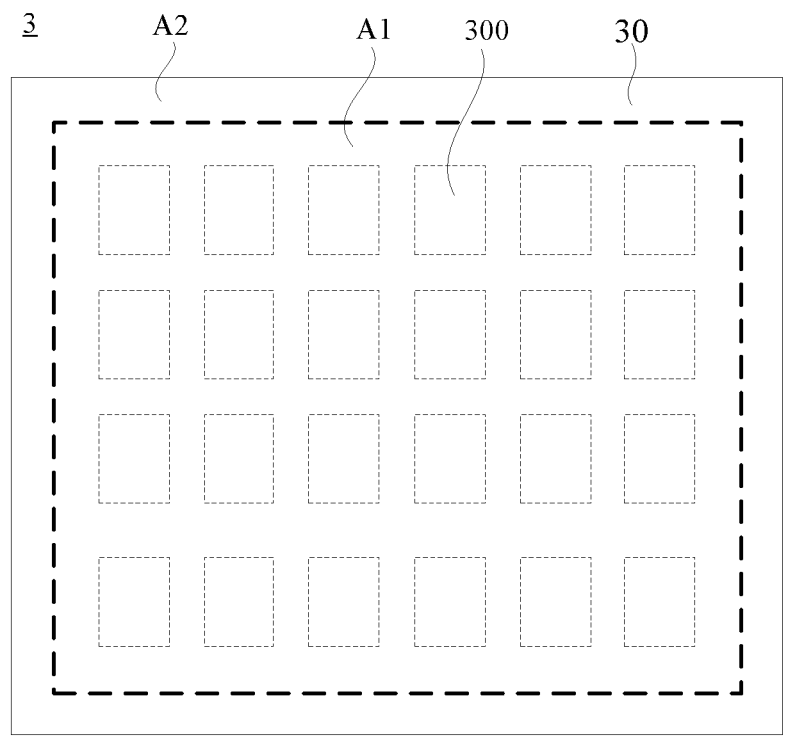
FIG. 3 is a diagram showing an arrangement of repeating units, in accordance with embodiments of the present disclosure.
Figure 4:
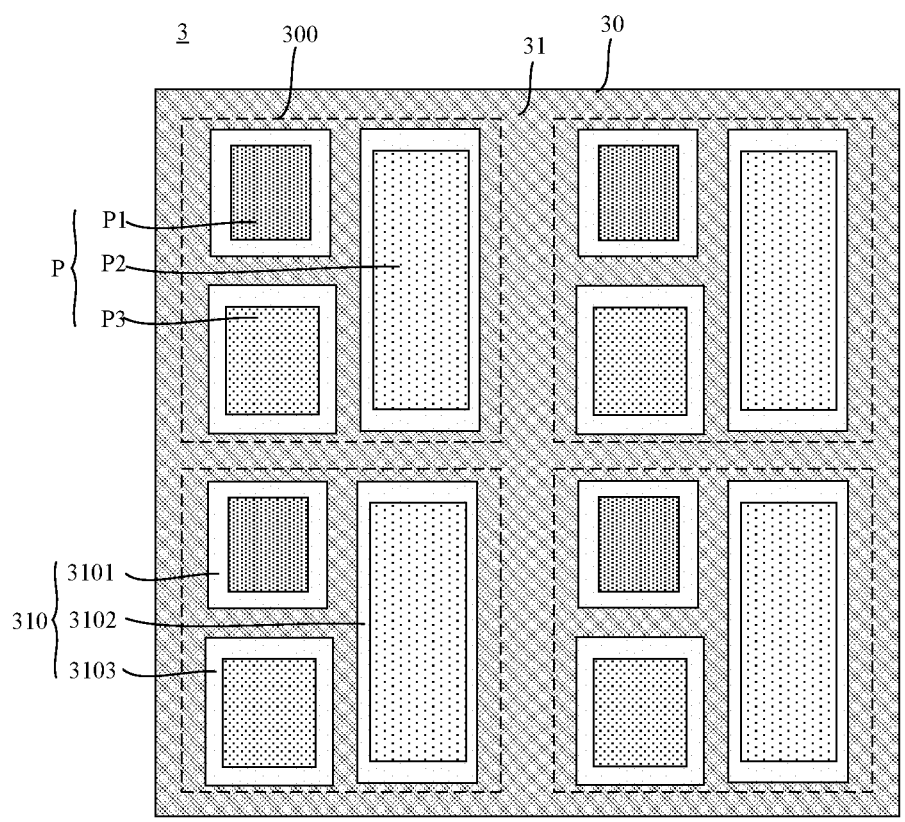
FIG. 4 is a diagram showing an arrangement of pixels of a display panel, in accordance with embodiments of the present disclosure.
Figure 5:
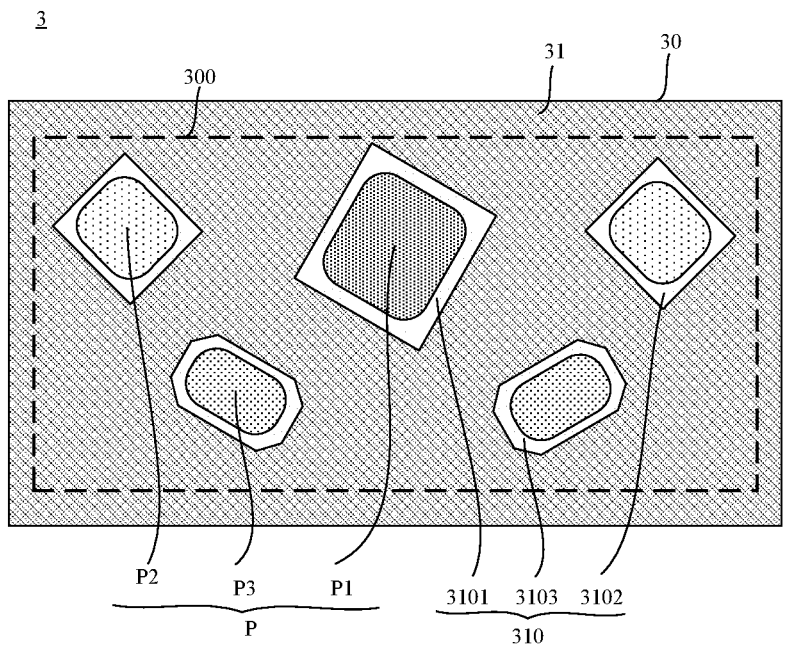
FIG. 5 is a diagram showing another arrangement of pixels of a display panel, in accordance with embodiments of the present disclosure.

Some embodiments of the present disclosure further provide the display panel 3. As shown in FIG. 3, the display panel 3 includes a substrate 30 and at least two repeating units 300 disposed on the substrate 30 and arranged in an array. Referring to FIGS. 4 and 5, each repeating unit 300 includes (e.g., three or five) sub-pixels P, and the sub-pixels P include a first color sub-pixel P1 and a second color sub-pixel P2. As the viewing angle increases, a luminance decay rate of the first color sub-pixel P1 is greater than a luminance decay rate of the second color sub-pixel P2. The display panel 3 further includes a light-shielding layer 31 disposed on a side of the at least two repeating units 300 away from the substrate 30, and the light-shielding layer 31 includes a plurality of opening portions 310. In a thickness direction of the substrate 30, a sub-pixel P corresponds to an opening portion 310, and each opening portion 310 exposes at least one portion of the sub-pixel P corresponding to the opening portion 310. The plurality of opening portions 310 include first opening portions 3101 respectively corresponding to first color sub-pixels P1 in the at least two repeating units 300, and second opening portions 3102 respectively corresponding to second color sub-pixels P2 in the at least two repeating units 300. Along a first direction, a difference between a length of the first opening portion 3101 and a length of a portion of the first color sub-pixel P1 exposed from the first opening portion 3101 is greater than a difference between a length of the second opening portion 3102 and a length of a portion of the second color sub-pixel P2 exposed from the second opening portion 3102. The first direction is a horizontal direction or a vertical direction.

It will be noted that in a case where the display device is a flexible display device, the display panel 3 is a flexible display panel, and in this case, the substrate 30 is a flexible substrate. The flexible substrate may be made of, for example, polyimide (PI), polyethylene terephthalate (PET), or other suitable material, which is not limited in the embodiments of the present disclosure. In a case where the display device is a rigid display device, the display panel 3 is a rigid display panel, and in this case, the substrate 30 is a rigid substrate. For example, the rigid substrate may be a glass substrate.

Those skilled in the art will understand that the display panel 3 has many different types of arrangements of the sub-pixels, and the repeating unit 300 in the embodiments of the present disclosure is a minimum repeating set composed of sub-pixels. A specific arrangement of the sub-pixels in the repeating unit 300 is not limited in the embodiments of the present disclosure. For example, referring to FIG. 4, an arrangement of the sub-pixels is an SRGB arrangement (also referred to as a standard RGB arrangement), and the minimum repeating set composed of the sub-pixels includes three sub-pixels P. In this case, each repeating unit 300 includes three sub-pixels P. The three sub-pixels P emit light of three different colors. For another example, referring to FIG. 5, an arrangement of the sub-pixels is a diamond arrangement (also referred to as a pentile arrangement). In this case, two adjacent pixels share a sub-pixel P (i.e., a light-emitting portion). The shared sub-pixel P may be a red sub-pixel, a green sub-pixel or a blue sub-pixel. FIG. 5 exemplarily illustrates that two adjacent pixels P share a first color sub-pixel P1. The minimum repeating set composed of sub-pixels includes five sub-pixels P. In this case, each repeating unit 300 includes five sub-pixels P.

Figure 6:
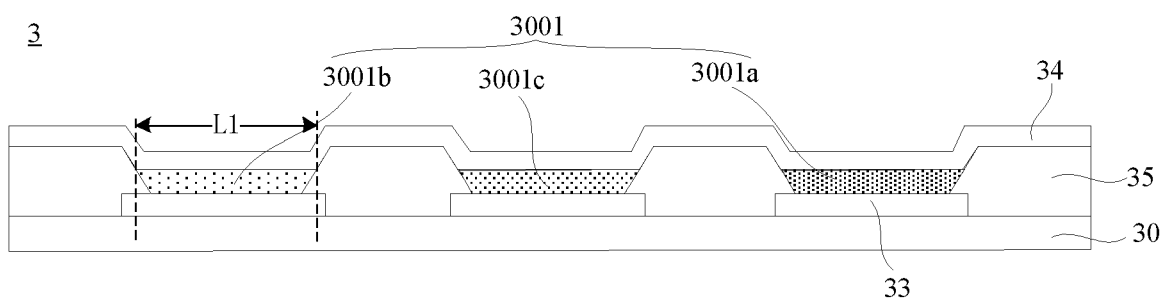
FIG. 6 is a structural diagram of a display panel, in accordance with embodiments of the present disclosure.
Figure 7:
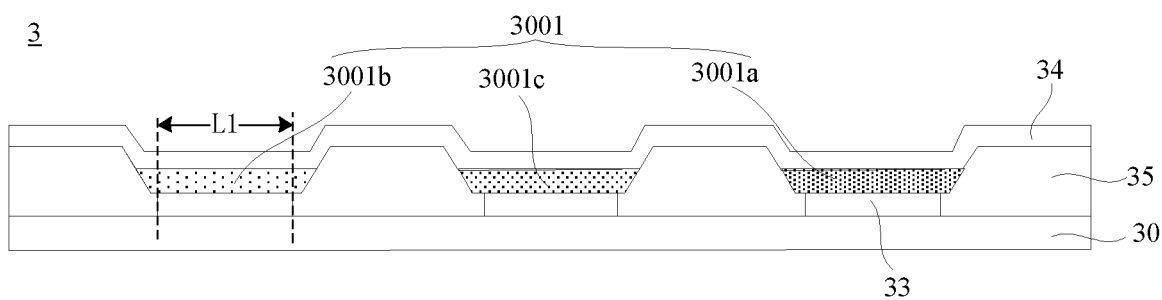
FIG. 7 is a structural diagram of another display panel, in accordance with embodiments of the present disclosure.

Solutions of the present disclosure will be described in an example where there is a single repeating unit 300, and the repeating unit 300 has the arrangement of the sub-pixels shown in FIG. 4. On this basis, as shown in FIGS. 6 and 7, the display panel 3 further includes first electrodes 33 and second electrodes 34, and a first electrode 33 and a second electrode 34 are respectively disposed on two opposite sides of a light-emitting portion. The first electrodes 33 and the second electrodes 34 are used to form an electric field for driving the repeating unit 300 to emit light. The display panel 3 further includes a pixel defining layer 35 disposed on the substrate 30 and located between the first electrodes 33 and the second electrodes 34. The pixel defining layer 35 includes a plurality of opening regions, and an opening region exposes a first electrode 33.

Figure 8:
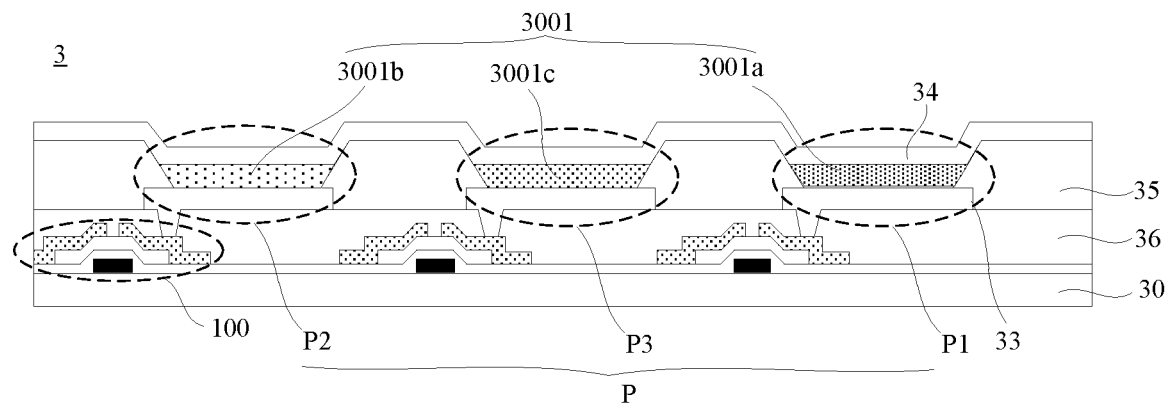
FIG. 8 is a structural diagram of yet another display panel, in accordance with embodiments of the present disclosure.

As shown in FIG. 8, the display panel 3 further includes a plurality of driving circuits disposed between the substrate 30 and the first electrodes 33, and a driving circuit is electrically connected to a first electrode 33. The driving circuit includes a plurality of thin film transistors 100, and a drain of a thin film transistor 100 serving as a driving transistor in the plurality of thin film transistors 100 is electrically connected to the first electrode 33. As shown in FIG. 8, the display panel 3 further includes a planarization layer 36 disposed on a side of the driving circuits away from the substrate 30.

For example, referring to FIG. 8, each sub-pixel P may include a light-emitting portion 3001. Light-emitting portions 3001 in the plurality of sub-pixels P emit light of different colors due to an action of the electric field formed by the first electrodes 33 and the second electrodes 34, and the light-emitting portions 3001 included in the plurality of sub-pixels P may also be referred to as a light-emitting layer. According to different light-emitting colors, the light-emitting portions 3001 may be classified into first color light-emitting portions 3001*a*, second color light-emitting portions 3001*b* and third color light-emitting portions 3001*c*. Each first color light-emitting portion 3001*a* is disposed in a first color sub-pixel P1, each second color light-emitting portion 3001*b* is disposed in a second color sub-pixel P2, and each third color light-emitting portion 3001*c* is disposed in a third color sub-pixel P3.

In some embodiments, the first electrode 33 is a cathode, and the second electrode 34 is an anode. In some other embodiments, the first electrode 33 is an anode, and the second electrode 34 is a cathode, which is not limited.

In some embodiments, the display panel 3 further includes one or more of an electron transport layer (ETL), an electron injection layer (EIL), a hole transport layer (HTL) and a hole injection layer (HIL).

In a case where the first electrode 33 is an anode and the second electrode 34 is a cathode, the hole injection layer and the hole transport layer are disposed between the first electrodes 33 and the light-emitting portions 3001, and the electron injection layer and the electron transport layer are disposed between the second electrodes 34 and the light-emitting portions 3001. In a case where the first electrode 33 is a cathode and the second electrode 34 is an anode, the hole injection layer and the hole transport layer are disposed between the second electrodes 34 and the light-emitting portions 3001, and the electron injection layer and the electron transport layer are disposed between the first electrodes 33 and the light-emitting portions 3001.

A shape of the opening portion 310 is not limited, as long as the opening portion 310 is able to expose the sub-pixel P. The opening portion 310 may completely expose the sub-pixel P, or may expose only a portion of the sub-pixel P. For example, the opening portion 310 may have other suitable shape such as a circular shape, a rectangular shape, a hexagonal shape, or an octagonal shape, or the opening portion 310 may have an irregular shape.

A length of the sub-pixel P is defined as a shortest distance, along the first direction, in distances each of which is a distance between any two points respectively on two opposite edges of an orthographic projection of the sub-pixel P on the substrate 30. A length of the opening portion 310 is defined as a shortest distance, along the first direction, in distances each of which is a distance between any two points respectively on two opposite edges of an orthogonal projection of the opening portion 310 on the substrate 30.

For example, as shown in FIG. 6, in a case where an orthographic projection of the light-emitting portion 3001 on the substrate 30 is located within an orthographic projection of the first electrode 33 on the substrate 30, i.e., in a case where an area of the orthographic projection of the light-emitting portion 3001 on the substrate 30 is less than an area of the orthographic projection of the first electrode 33 on the substrate 30, the length L1 of the sub-pixel P is a shortest distance, along the first direction, in distances each of which is a distance between any two points respectively on two opposite edges of the orthographic projection of the light-emitting portion 3001 on the substrate 30. As shown in FIG. 7, in a case where the orthographic projection of the first electrode 33 on the substrate 30 is located within the orthographic projection of the light-emitting portion 3001 on the substrate 30, i.e., in a case where the area of the orthographic projection of the first electrode 33 on the substrate 30 is less than that area of the orthographic projection of the light-emitting portion 3001 on the substrate 30, the length L1 of the sub-pixel P is a shortest distance, along the first direction, in distances each of which is a distance between any two points respectively on two opposite edges of the orthographic projection of the first electrode 33.

Figure 9:
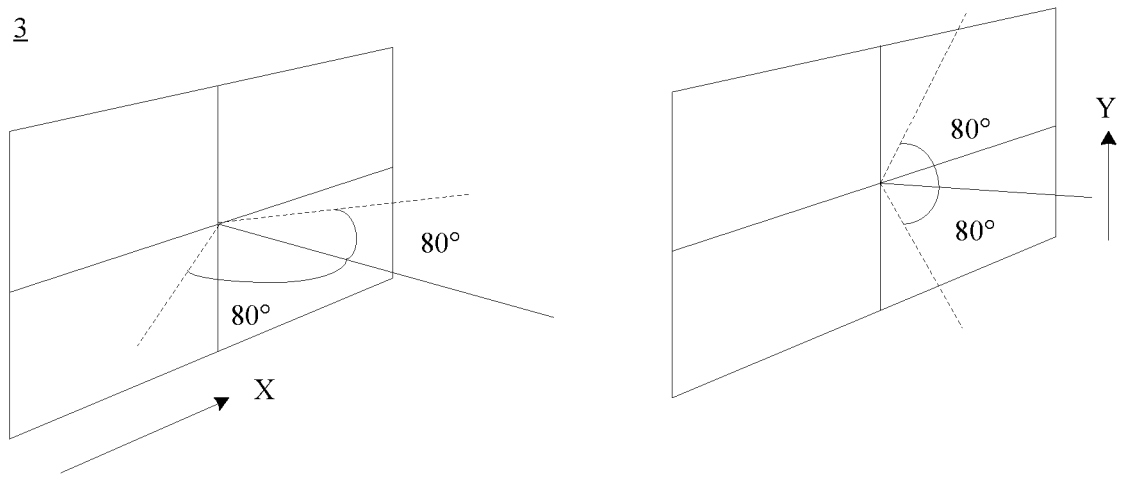
FIG. 9 is a diagram showing visual angles of a display panel, in accordance with embodiments of the present disclosure.

For example, the viewing angle (i.e., visual angle) refers to an angle between a line of sight and a plane perpendicular to a screen when a user's eyes may just see an image with a contrast of 10 or more. As shown in FIG. 9, FIG. 9 exemplarily illustrates a visula angle of 80°. Referring to FIG. 9, the viewing angle includes a horizontal viewing angle and a vertical viewing angle. The horizontal viewing angle is a viewing angle along the horizontal direction, and the vertical viewing angle is a viewing angle along the vertical direction. Therefore, the first direction in the embodiments of the present disclosure is a direction of the horizontal viewing angle (i.e., horizontal direction or X direction) or a direction of the vertical viewing angle (i.e, vertical direction or Y direction).

A first color and a second color are not limited. For example, the first color and the second color may be one of red, green and blue.

It will be noted that as the viewing angle increases, a luminance decay rate of a green sub-pixel is greater than a luminance decay rate of a blue sub-pixel, and is less than a luminance decay rate of a red sub-pixel. In the embodiments of the present disclosure, the luminance decay rate of the first color sub-pixel P1 is greater than the luminance decay rate of the second color sub-pixel P2. On this basis, for example, the first color sub-pixel P1 is the red sub-pixel, and the second color sub-pixel P2 is the blue sub-pixel. For another example, the first color sub-pixel P1 is the green sub-pixel, and the second color sub-pixel P2 is the blue sub-pixel. For yet another example, the first color sub-pixel P1 is the red sub-pixel, and the second color sub-pixel P2 is the green sub-pixel.

A material of the light-shielding layer 31 is not limited. For example, the light-shielding layer 31 is made of a light-absorbing material. The light-absorbing material refers to a material with an absorptivity of 80% or more with respect to visible light. The light-absorbing material may be, for example, a black light-absorbing material. The black light-absorbing material may be, for example, a composite material of a black additive and a resin. Alternatively, the material of the black light-absorbing material may be the same as a material of the black matrix (BM). For example, the light-shielding layer 31 is made of a metal material. The metal material may reflect light emitted from the sub-pixel P to an internal structure of the display panel 3, so that the light does not exit from a light exit side of the display panel 3. The metal material may be, for example, gold (Au), platinum (Pt), aluminum (Al), a metal compound or other suitable material, which is not limited in the embodiments of the present disclosure.

In a case where the light-shielding layer 31 is made of the light-absorbing material, the light-absorbing material has a thickness D1, and D1 is greater than or equal to 0.1 μm and less than or equal to 1.5 μm (i.e., 0.1 μm≤D1≤1.5 μm). In a case where the light-shielding layer 31 is made of the metal material, the metal material has a thickness D2, and D2 is greater than or equal to 10 nm and less than or equal to 1000 nm (i.e., 10 nm≤D2≤1000 nm). For example, the thickness D1 of the light-absorbing material is 0.8 μm, or the thickness D2 of the metal material is 100 nm.

Based on the above, when the luminance decay rate of the green sub-pixel, the luminance decay rate of the red sub-pixel, and the luminance decay rate of the blue sub-pixel are compared at a same viewing angle (for example, the viewing angle is 70°), the higher the luminance decay rate of a sub-pixel P of a certain color, the lower the luminance of light of this color emitted from the sub-pixel P. On this basis, the length of the opening portion 310 corresponding to the sub-pixel P of this color is accordingly increased, so that more light passes through the opening portion 310, thereby increasing the luminance of the light of this color emitted from the sub-pixel P. Similarly, the lower the luminance decay rate of a sub-pixel P of a certain color, the higher the luminance of light of this color emitted from the sub-pixel P. On this basis, the length of the opening portion 310 corresponding to the sub-pixel P of this color is accordingly reduced, so that more light is absorbed or reflected by the light-shielding layer 31, thereby reducing the luminance of the light of this color emitted from the sub-pixel P.

In the embodiments of the present disclosure, the display panel 3 includes the at least two repeating units, the repeating unit 300 includes the sub-pixels P, and the sub-pixels P include the first color sub-pixel P1 and the second color sub-pixel P2. The display panel 3 includes the light-shielding layer 31 disposed on the side of the at least two repeating units 300 away from the substrate 30, and the light-shielding layer 31 includes the plurality of opening portions 310. The plurality of opening portions 310 include the first opening portions 3101 respectively corresponding to the first color sub-pixels P1 in the at least two repeating units 300, and the second opening portions 3102 respectively corresponding to the second color sub-pixels P2 in the at least two repeating units 300. That is, the first opening portion 3101 exposes the first color sub-pixel P1, and the second opening portion 3102 exposes the second color sub-pixel P2. In addition, since as the viewing angle increases, the luminance decay rate of the first color sub-pixel P1 is greater than the luminance decay rate of the second color sub-pixel P2, a luminance of light emitted from the first color sub-pixel P1 is less than a luminance of light emitted from the second color sub-pixel P2 at the same viewing angle. However, since the difference between the length of the first opening portion 3101 and the length of the portion of the first color sub-pixel P1 exposed from the first opening portion 3101 is greater than the difference between the length of the second opening portion 3102 and the length of the portion of the second color sub-pixel P2 exposed from the second opening portion 3102, the first color sub-pixel P1 emits more light from the first opening portion 3101, and the second color sub-pixel P2 emits less light from the second opening portion 3102, so that the luminance decay rate of the first color sub-pixel P1 may be close to the luminance decay rate of the second color sub-pixel P2. That is, the luminance of the light emitted from the first color sub-pixel P1 is close to the luminance of the light emitted from the second color sub-pixel P2 at a large viewing angle along the first direction, thereby improving the color shift at the large viewing angle.

Figure 10:
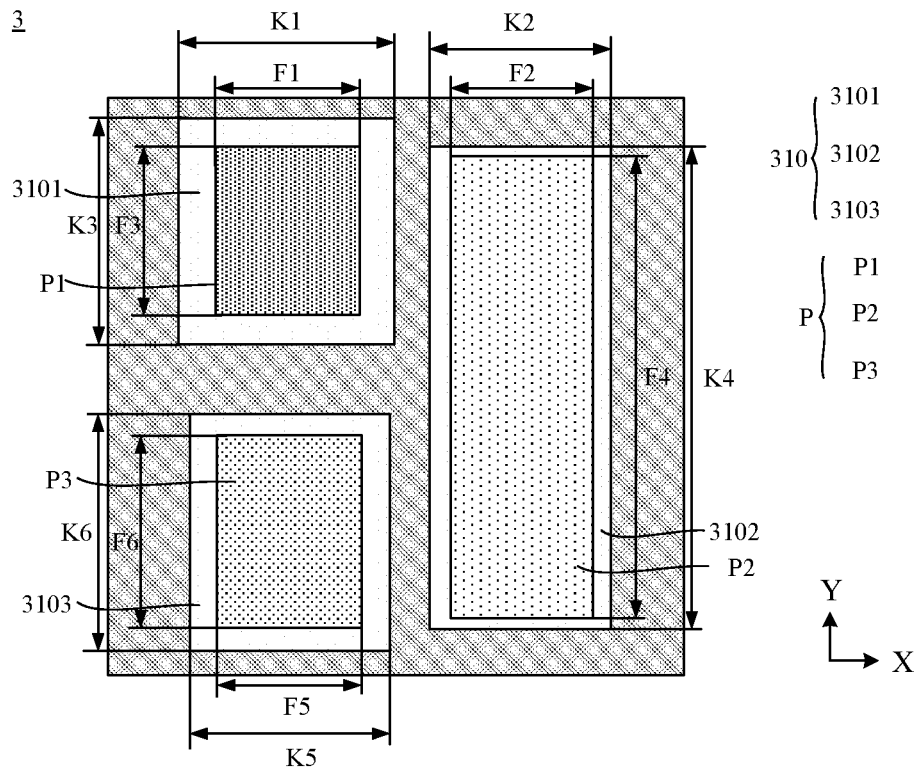
FIG. 10 is a structural diagram showing opening lengths and light-emitting lengths of a display panel, in accordance with embodiments of the present disclosure.

For example, as shown in FIG. 10, a ratio of a first opening length K1 to a first light-emitting length F1 is greater than a ratio of a second opening length K2 to a second light-emitting length F2. The first opening length K1 is the length of the first opening portion 3101 along the first direction, and the first light-emitting length F1 is the length, along the first direction, of the portion of the first color sub-pixel P1 exposed from the first opening portion 3101. The second opening length K2 is the length of the second opening portion 3102 along the first direction, and the second light-emitting length F2 is the length, along the first direction, of the portion of the second color sub-pixel P2 exposed from the second opening portion 3102. In a case where only differences between the light-emitting lengths of the sub-pixels P of different colors along the first direction are considered, and differences between the luminance decay rates of the sub-pixels P of different colors are ignored, when corresponding opening lengths along the first direction are set, it is necessary to make an area of the opening portion capable of emitting light as large as possible to ensure the light-emitting efficiency. The opening length needs to be positively correlated with the light-emitting length. That is, the larger the length of the sub-pixel is, the larger the corresponding opening length is, so that the sub-pixel P is exposed from the opening portion as much as possible. Moreover, in order to ensure that an influence degree of the opening portion on a light-emitting effect of a sub-pixel P of a different color is consistent, the ratio of the first opening length K1 to the first light-emitting length F1 should be set to be equal to the ratio of the second opening length K2 to the second light-emitting length F2. In this case, considering the luminance decay rate of the first color sub-pixel P1 is greater than the luminance decay rate of the second color sub-pixel P2, in order to avoid the color shift at the large viewing angle, it is necessary to balance the luminance decay rate of the first color sub-pixel P1 and the luminance decay rate of the second color sub-pixel P2. Therefore, on a basis that the ratio of the first opening length K1 to the first light-emitting length F1 is equal to the ratio of the second opening length K2 to the second light-emitting length F2, the first opening length K1 should be increased, and/or the second opening length K2 should be reduced, so as to reduce the luminance decay rate of the first color sub-pixel P1 and/or increase the luminance decay rate of the second color sub-pixel P2. Thus, the luminance of the light emitted from the first color sub-pixel P1 is close to the luminance of the light emitted from the second color sub-pixel P2 at the large viewing angle along the first direction, thereby improving the color shift at the large viewing angle.

Figure 11:
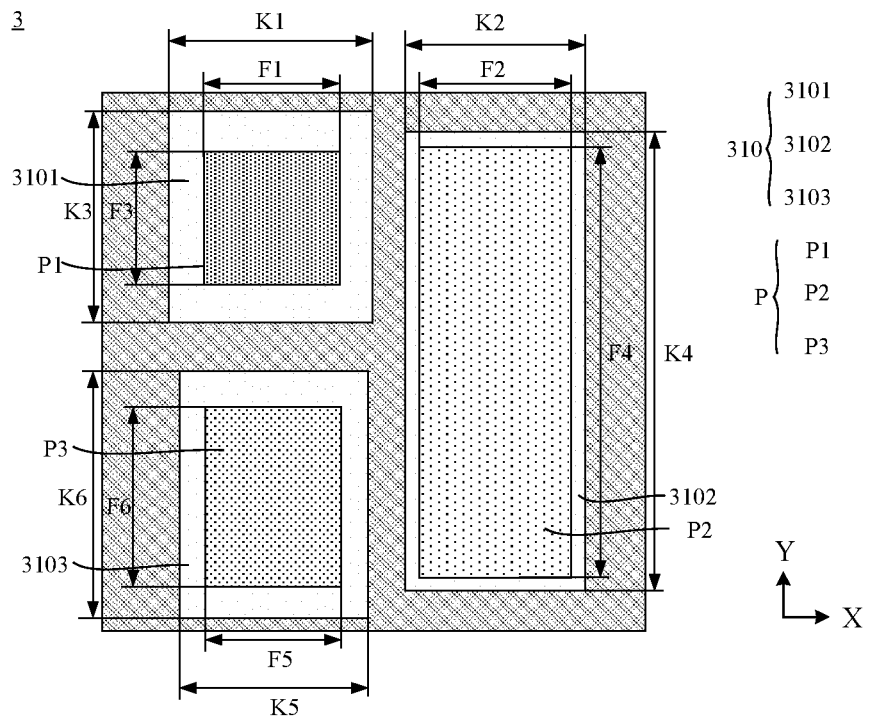
FIG. 11 is a structural diagram showing opening lengths and light-emitting lengths of another display panel, in accordance with embodiments of the present disclosure.

For example, referring to FIG. 10, along the X direction, the first-emitting length F1 of the first color sub-pixel P1 is equal to the second-emitting length F2 of the second color sub-pixel P2, and the ratio of the first opening length K1 to the first light-emitting length F1 is greater than the ratio of the second opening length K2 to the second light-emitting length F2. In this case, the first opening length K1 is greater than the second opening length K2. For another example, referring to FIG. 11, along the X direction, the first light-emitting length F1 of the first color sub-pixel P1 is less than the second light-emitting length F2 of the second color sub-pixel P2. Similarly, the ratio of the first opening length K1 to the first light-emitting length F1 is greater than the ratio of the second opening length K2 to the second light-emitting length F2. In this case, the first opening length K1 and the second opening length K2 are not specifically limited, as long as the respective ratios satisfy the above limiting condition. For example, referring to FIGS. 10 and 11, the second direction exists, and the second direction is perpendicular to the first direction. For example, in a case where the first direction is the direction of the horizontal viewing angle (i.e., horizontal direction), the second direction is the direction of the vertical viewing angle (i.e., vertical direction). Along the second direction, a difference between a length of the first opening portion 3101 and a length of a portion of the first color sub-pixel P1 exposed from the first opening portion 3101 is greater than a difference between a length of the second opening portion 3102 and a length of a portion of the second color sub-pixel P2 exposed from the second opening portion 3102. Referring to FIGS. 10 and 11, along the Y direction, a ratio of a third opening length K3 to a third light-emitting length F3 is greater than a ratio of a fourth opening length K4 to a fourth light-emitting length F4. The third opening length K3 is the length of the first opening portion 3101 along the second direction, and the third light-emitting length F3 is the length, along the second direction, of the portion of the first color sub-pixel P1 exposed from the first opening portion 3101. The fourth opening length K4 is the length of the second opening portion 3102 along the second direction, and the fourth light-emitting length F4 is the length, along the second direction, of the portion of the second color sub-pixel P2 exposed from the second opening portion 3102. This arrangement has similar beneficial effects to the corresponding arrangement along the first direction, which will not be repeated here. In a case where the opening lengths and the light-emitting lengths along the first direction and the second direction satisfy the above respective limitations, the color shifts at the large viewing angles along different directions are able to be alleviated, so that a color tone uniformity of the display panel at a different viewing angle is improved, and the display effect of the display panel at a plurality of viewing angles is improved.

In some embodiments, as shown in FIGS. 10 and 11, the sub-pixels P in the repeating unit 300 further includes the third color sub-pixel P3. A luminance decay rate of the third color sub-pixel P3 is less than the luminance decay rate of the first color sub-pixel P1, and is greater than the luminance decay rate of the second color sub-pixel P2.

On this basis, as shown in FIGS. 10 and 11, the plurality of opening portions 310 further include third opening portions 3103 respectively corresponding to third color sub-pixels P3 in the at least two repeating units 300. Along the first direction, a difference between a length of the third opening portion 3103 and a length of a portion of the third color sub-pixel P3 exposed from the third opening portion 3103 is less than the difference between the length of the first opening portion 3101 and the length of the portion of the first color sub-pixel P1 exposed from the first opening portion 3101, and is greater than the difference between the length of the second opening portion 3102 and the length of the portion of the second color sub-pixel P2 exposed from the second opening portion 3102.

In a case where the sub-pixels P in the repeating unit 300 further includes the third color sub-pixel P3, the luminance decay rate of the third sub-pixel P3 is less than the luminance decay rate of the first color sub-pixel P1, and is greater than the luminance decay rate of the second color sub-pixel P2. The plurality of opening portions 310 further include the third opening portions 3103 respectively corresponding to the third color sub-pixels P3 in the at least two repeating units 300. The difference between the length of the third opening portion 3103 and the length of the portion of the third color sub-pixel P3 exposed from the third opening portion 3103 is less than the difference between the length of the first opening portion 3101 and the length of the portion of the first color sub-pixel P1 exposed from the first opening portion 3101, and is greater than the difference between the length of the second opening portion 3102 and the length of the portion of the second color sub-pixel P2 exposed from the second opening portion 3102. Therefore, the luminance decay rate of the first color sub-pixel P1, the luminance decay rate of the second color sub-pixel P2 and the luminance decay rate of the third color sub-pixel P3 may be close to each other. Thus, at a large viewing angle, the luminance of the light emitted from the first color sub-pixel P1, the luminance of the light emitted from the second color sub-pixel P2 and a luminance of light emitted from the third color sub-pixel P3 are close to each other, so that the color shift at the large viewing angle may be improved.

For example, referring to FIGS. 10 and 11, a ratio of a fifth opening length K5 to a fifth light-emitting length F5 is less than the ratio of the first opening length K1 to the first light-emitting length F1, and is greater than the ratio of the second opening length K2 to the second light-emitting length F2. The fifth opening length K5 is a length of the third opening portion 3103 along the first direction, and the fifth light-emitting length F5 is a length, along the first direction, of the portion of the third color sub-pixel P3 exposed from the third opening portion 3103. Similar to the case that the ratio of the first opening length K1 to the first light-emitting length F1 is greater than the ratio of the second opening length K2 to the second light-emitting length F2, in a case where the display panel further has the third color sub-pixels P3, in the above arrangement, the luminance decay rates of the sub-pixels of different colors may be accordingly increased or reduced, so that at the large viewing angle along the first direction, the luminance of the light emitted from the first color sub-pixel P1, the luminance of the light emitted from the second color sub-pixel P2, and the luminance of the light emitted from the third color sub-pixel P3 are close to each other, thereby improving the color shift at the large viewing angle. In combination with the above embodiments, for example, along the second direction, the difference between the length of the third opening portion 3103 and the length of the portion of the third color sub-pixel P3 exposed from the third opening portion 3103 is less than the difference between the length of the first opening portion 3101 and the length of the portion of the first color sub-pixel P1 exposed from the first opening portion 3101, and is greater than the difference between the length of the second opening portion 3102 and the length of the portion of the second color sub-pixel P2 exposed from the second opening portion 3102.

For example, referring to FIGS. 10 and 11, a ratio of a sixth opening length K6 to a sixth light-emitting length F6 is less than the ratio of the third opening length K3 to the third light-emitting length F3, and is greater than the ratio of the fourth opening length K4 to the fourth light-emitting length F4. The sixth opening length K6 is a length of the third opening portion 3103 along the second direction, and the sixth light-emitting length F6 is a length, along the second direction, of the portion of the third color sub-pixel P3 exposed from the third opening portion 3103. This arrangement has similar beneficial effects to the corresponding arrangement along the first direction, which will not be repeated here. In a case where the opening lengths and the light-emitting lengths along the first direction and the second direction satisfy the above respective limitations, the color shifts at the large viewing angles along different directions are able to be alleviated, so that a color tone uniformity of the display panel at a different viewing angle is improved, and the display effect of the display panel at a plurality of viewing angles is improved.

It will be noted that in a case where the first direction is the horizontal direction, the second direction is the vertical direction. In a case where the first direction is the vertical direction, the second direction is the horizontal direction. Hereinafter, in the embodiments of the present disclosure, as an example, the first direction is the horizontal direction, and the second direction is the vertical direction for illustration.

In the embodiments of the present disclosure, along both the first direction and the second direction, the luminance decay rate of the first color sub-pixel P1, the luminance decay rate of the second color sub-pixel P2, and the luminance decay rate of the third color sub-pixel P3 may be close to each other. Therefore, at the large viewing angle along the first direction and the second direction, the luminance of the light emitted from the first color sub-pixel P1, the luminance of the light emitted from the second color sub-pixel P2 and the luminance of the light emitted from the third color sub-pixel P3 are close to each other. That is, the user sees an image having luminances close to each other at horizontal viewing angles, and an image having luminances close to each other at vertical viewing angles, so that the color shift at the large viewing angle is able to be further improved.

Figure 12:
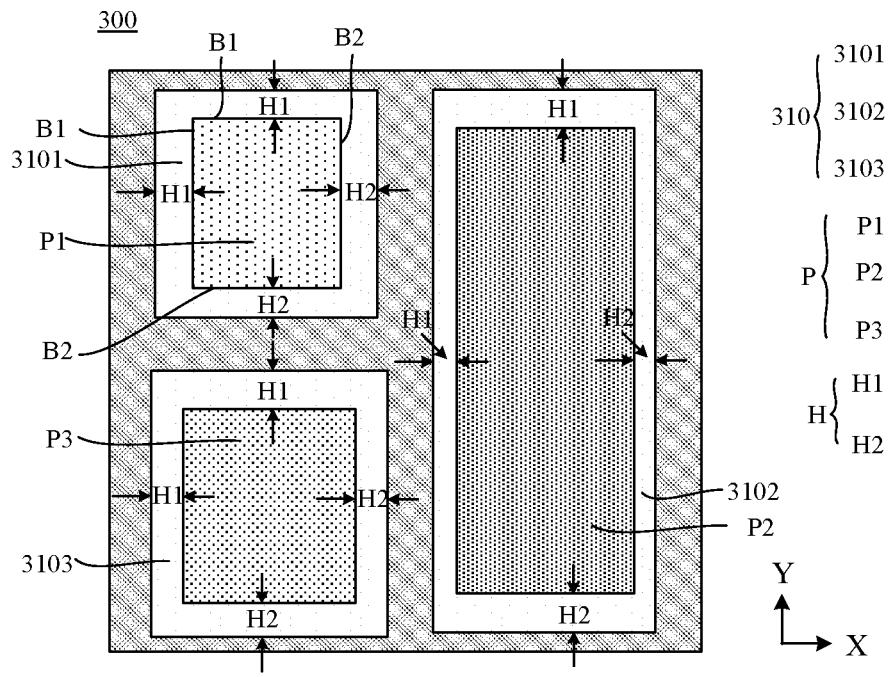
FIG. 12 is a structural diagram of a loop-shaped gap, in accordance with embodiments of the present disclosure.

For example, referring to FIG. 12, the orthographic projection of the sub-pixel P on the substrate 30 is located within the orthogonal projection of the opening portion corresponding to the sub-pixel P on the substrate 30. For example, the orthographic projection of the sub-pixel P on the substrate 30 and the orthogonal projection of the opening portion 310 on the substrate 30 are completely covered by the opening portion 310. That is, the sub-pixel P is completely exposed by the opening portion 310, and is able to emit more light from the opening portion 310, so that a display image with a higher luminance and a higher clarity may be obtained without increasing the energy consumption of the display panel, thereby improving the display effect of the display panel.

In some embodiments, as shown in FIG. 12, a boundary of the orthogonal projection of the opening portion 310 on the substrate 30 and a boundary of the orthographic projection of the sub-pixel P on the substrate 30 have a loop-shaped gap H therebetween. That is, the orthographic projection of the sub-pixel P on the substrate 30 is located within the orthogonal projection of the opening portion 310 on the substrate 30, and the boundary of the orthographic projection of the sub-pixel P on the substrate 30 and the boundary of the orthogonal projection of the opening portion 310 on the substrate 30 do not coincide, and have a gap therebetween. Since the light emitted from the sub-pixel P is not collimated but diffused, a dimension of the opening portion 310 is greater than a dimension of the sub-pixel P corresponding thereto, so that more light is able pass through the opening portion 310, and a better display effect may be obtained without increasing the energy consumption.

Figure 13:
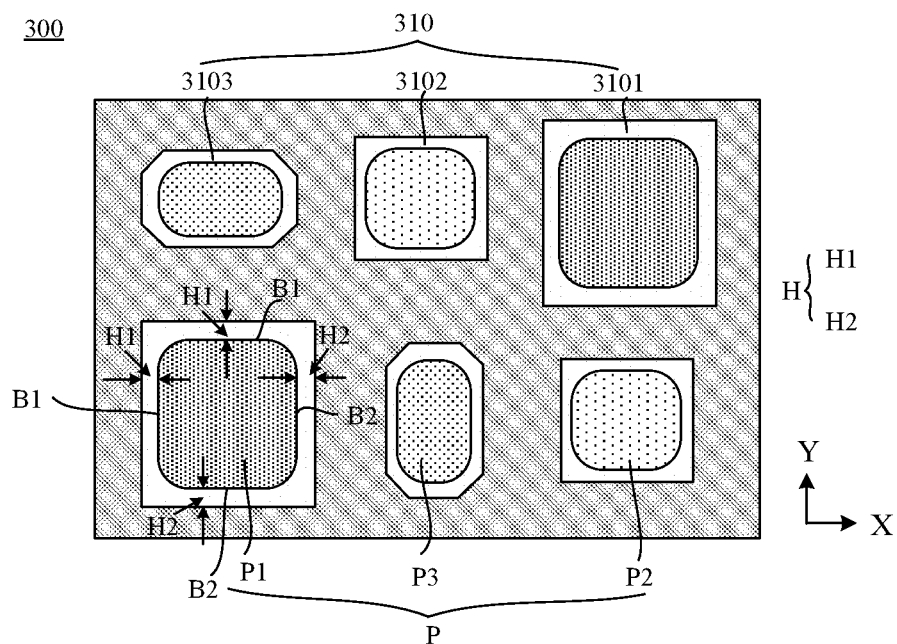
FIG. 13 is a structural diagram of another loop-shaped gap, in accordance with embodiments of the present disclosure.
Figure 14:
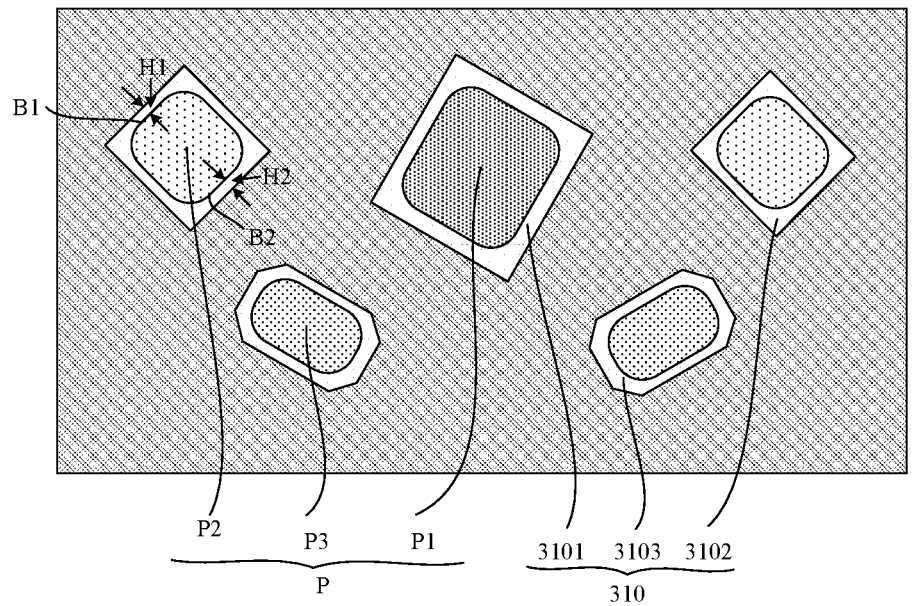
FIG. 14 is a structural diagram of yet another loop-shaped gap, in accordance with embodiments of the present disclosure.

For example, referring to FIG. 12, the boundary of the orthographic projection of the sub-pixel P on the substrate 30 has first edges B1 and second edges B2, and a first edge B1 and a second edge B2 are parallel to each other. The loop-shaped gap H includes first sub-gaps H1 and second sub-gaps H2. A first sub-gap H1 is a gap between a first edge B1 and a corresponding edge of the boundary of the orthogonal projection of the opening portion 310 on the substrate 30. A second sub-gap H2 is a gap between a second edge B2 and a corresponding edge of the boundary of the orthogonal projection of the opening portion 310 on the substrate 30. The first sub-gap H1 and the second sub-gap H2 have the same width at all positions. For example, referring to FIG. 12, the sub-pixel P and the opening portion 310 are each in a rectangular shape. The sub-pixels P are arranged in an array, the opening portions 310 are arranged in an array, and the sub-pixels P and the opening portions 310 are in one-to-one correspondence. In an example where parallel edges of the orthographic projection of the first color sub-pixel P1 on the substrate 30 along the second direction are respectively a first edge B1 and a second edge B2, a gap between the first edge B1 and a corresponding edge of the boundary of the orthogonal projection of the opening portion 310 on the substrate 30 is a first sub-gap H1, and a gap between the second edge B2 and a corresponding edge of the boundary of the orthogonal projection of the opening portion 310 on the substrate 30 is a second sub-gap H2. The first sub-gap H1 and the second sub-gap H2 have the same width along the first direction at all positions. For another example, referring to FIG. 13, the shapes of the sub-pixels P and the opening portions 310 are polygonal and rectangular shapes. The sub-pixels P are arranged in an array, the opening portions 310 are arranged in an array, and the sub-pixels P and the opening portions 310 are in one-to-one correspondence. In an example where parallel edges of the orthographic projection of the first color sub-pixel P1 on the substrate 30 along the second direction are respectively a first edge B1 and a second edge B2, a gap between the first edge B1 and a corresponding edge of the boundary of the orthogonal projection of the opening portion 310 on the substrate 30 is a first sub-gap H1, and a gap between the second edge B2 and a corresponding edge of the boundary of the orthogonal projection of the opening portion 310 on the substrate 30 is a second sub-gap H2. The first sub-gap H1 and the second sub-gap H2 have the same width along the first direction at all positions. For another example, referring to FIG. 14, the shapes of the sub-pixels P and the opening portions 310 are polygonal and rectangular shapes. The sub-pixels P and the opening portions 310 are in one-to-one correspondence, neither the sub-pixels P nor the opening portions 310 are arranged in an array. In an example where parallel edges of the orthographic projection of the first color sub-pixel P1 on the substrate 30 are respectively a first edge B1 and a second edge B2, a gap between the first edge B1 and a corresponding edge of the boundary of the orthogonal projection of the opening portion 310 on the substrate 30 is a first sub-gap H1, and a gap between the second edge B2 and a corresponding edge of the boundary of the orthogonal projection of the opening portion 310 on the substrate 30 is a second sub-gap H2. The first sub-gap H1 and the second sub-gap H2 have the same width at all positions.

The first sub-gap H1 has the same width at all positions, the second sub-gap H2 has the same width at all positions, and the first sub-gap H1 and the second sub-gap H2 have the same width along the first direction. That is, in the sub-pixels P of the same color, the first sub-gaps H1 and the second sub-gaps H2 have the same width along the first direction at all positions. In the sub-pixels P of different colors, the width of the first sub-gap H1 along the first direction and the width of the second sub-gap H2 along the first direction are not limited, as long as the luminance decay rates are able to be balanced, i.e., as long as the luminance decay rates of the first color sub-pixel P1, the second color sub-pixel P2, and the third color sub-pixel P3 are able to be close to each other. In a case where parallel edges of the orthographic projection of the sub-pixel P on the substrate 30 along the first direction are respectively a first edge B1 and a second edge B2, the above limiting relationships also exist. Moreover, in the sub-pixels P of the same color, the width of the first sub-gap H1 or the second sub-gap H2 along the first direction may be the same as or different from the width of the first sub-gap H1 or the second sub-gap H2 along the second direction, which is not limited, similarly, as long as the luminance decay rates are able to be balanced, i.e., as long as the luminance decay rates of the sub-pixels P of the same color along the first direction and the second direction are close to each other. That is, luminance decay rates of the display panel along the first direction and the second direction are close to each other, so that when the viewing angle is changed from the first direction to the second direction, a color shift difference of the display panel is small, and the display panel has a good color uniformity in different directions.

In a case where the first sub-gaps H1 and the second sub-gaps H2 in the sub-pixels P of the same color have the same width along the first direction at all positions, at all positions along the first direction (i.e., horizontal direction), e.g., the horizontal viewing angle is in a range of −80° to 80°, the first opening portion 3101 is used to equalize the luminance decay rate of the first color sub-pixel P1, the second opening portion 3102 is used to equalize the luminance decay rate of the second color sub-pixel P2, and the third opening portion 3103 is used to equalize the luminance decay rate of the third color sub-pixel P3. Therefore, at all positions along the horizontal direction, the light emitted from the first color sub-pixel P1 has the same luminance, the light emitted from the second color sub-pixel P2 has the same luminance, and the light emitted from the third color sub-pixel P3 has the same luminance, so that at all positions along the horizontal direction, the luminance of the light emitted from the first color sub-pixel P1, the luminance of the light emitted from the second color sub-pixel P2 and the luminance of the light emitted from the third color sub-pixel P3 are close to each other, and thus the user sees an image having luminances close to each other at horizontal viewing angles.

In a case where the first sub-gaps H1 and the second sub-gaps H2 in the sub-pixels P of the same color have the same width along the second direction at all positions, at all positions along the second direction (i.e., vertical direction), e.g., the vertical viewing angle is in a range of −80° to 80°, the first opening portion 3101 is used to equalize the luminance decay rate of the first color sub-pixel P1, the second opening portion 3102 is used to equalize the luminance decay rate of the second color sub-pixel P2, and the third opening portion 3103 is used to equalize the luminance decay rate of the third color sub-pixel P3. Therefore, at all positions along the vertical direction, the light emitted from the first color sub-pixel P1 has the same luminance, the light emitted from the second color sub-pixel P2 has the same luminance, and the light emitted from the third color sub-pixel P3 has the same luminance, so that at all positions along the vertical direction, the luminance of the light emitted from the first color sub-pixel P1, the luminance of the light emitted from the second color sub-pixel P2 and the luminance of the light emitted from the third color sub-pixel P3 are close to each other, and thus the user sees an image having luminances close to each other at vertical viewing angles.

Based on the above, similarly, in a case where the first sub-gaps H1 and the second sub-gaps H2 in the sub-pixels P of the same color have the same width along the first direction and the second direction at all positions, at all positions along the horizontal direction, the luminance of the light emitted from the first color sub-pixel P1, the luminance of the light emitted from the second color sub-pixel P2 and the luminance of the light emitted from the third color sub-pixel P3 are close to each other, so that the user see an image having luminances close to each other at horizontal viewing angles; at all positions along the vertical direction, the luminance of the light emitted from the first color sub-pixel P1, the luminance of the light emitted from the second color sub-pixel P2 and the luminance of the light emitted from the third color sub-pixel P3 are close to each other, so that the user see an image having luminances close to each other at vertical viewing angles. Therefore, the color shift at the large viewing angle is able to be better improved.

Figure 15:
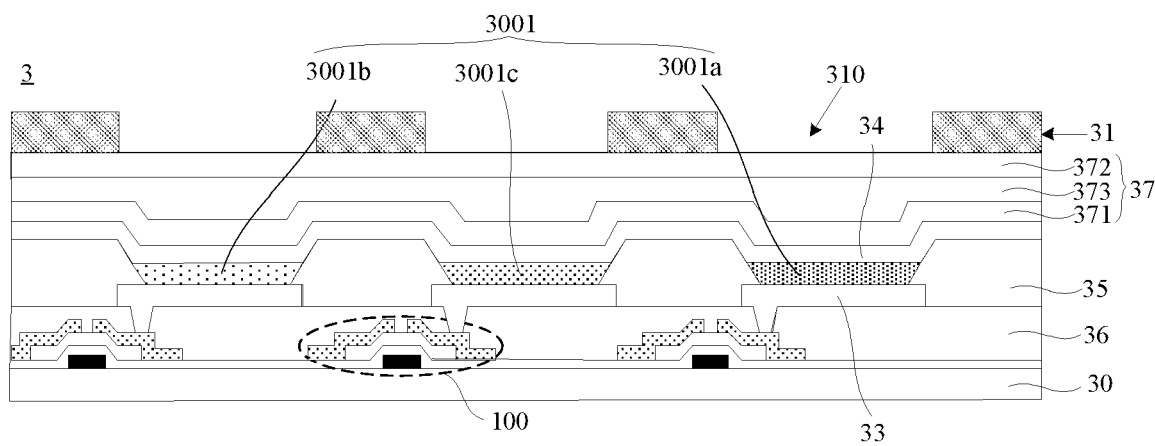
FIG. 15 is a structural diagram of yet another display panel, in accordance with embodiments of the present disclosure.

In some embodiments, as shown in FIG. 15, the display panel 3 further includes an encapsulation layer 37, and the light-shielding layer 31 is disposed on a side surface of the encapsulation layer 37 away from the substrate 30.

Here, the encapsulation layer 37 may be an encapsulation substrate or encapsulation film(s). In a case where the encapsulation layer 37 is the encapsulation film(s), the number of the encapsulation film(s) included in the encapsulation layer 37 is not limited. The encapsulation layer 37 may include an encapsulation film, or the encapsulation layer 37 may include two or more encapsulation films that are stacked. In some embodiments, as shown in FIG. 15, the encapsulation layer 37 includes three encapsulation films that are stacked in sequence. For example, the three encapsulation films are a first encapsulation film 371, a second encapsulation film 372, and a third encapsulation film 373 disposed between the first encapsulation film 371 and the second encapsulation film 372, respectively.

In a case where the encapsulation layer 37 includes the first encapsulation film 371, the second encapsulation film 372 and the third encapsulation film 373, for example, the third encapsulation film 373 is made of an organic material, and the first encapsulation film 371 and the second encapsulation film 372 are each made of an inorganic material.

Here, the organic material is not limited, and may be, for example, polymethyl methacrylate (PMM). The inorganic material is not limited, and may be, for example, one or more of $SiN_x$ (silicon nitride), $SiO_x$ (silicon oxide) or $SiO_xN_y$ (silicon oxynitride).

On this basis, the third encapsulation film 373 may be manufactured by using an ink jet printing (IJP) process. In addition, the first encapsulation film 371 and the second encapsulation film 372 may be manufactured by using chemical vapor deposition (CVD).

In the embodiments of the present disclosure, the encapsulation layer 37 includes the first encapsulation film 371, the second encapsulation film 372, and the third encapsulation film 373 disposed between the first encapsulation film 371 and the second encapsulation film 372, and the third encapsulation film 373 is made of the organic material having a good toughness, which is beneficial for the display device to realize curved display. Since the first encapsulation film 371 and the second encapsulation film 372 are each made of the inorganic material, on one hand, water and oxygen in the outside air may be isolated, and on another hand, the third encapsulation film 373 may be protected from being scratched and damaged.

For example, the thickness of the third encapsulation film 373 is greater than the thickness of each of the first encapsulation film 371 and the second encapsulation film 372. The thickness of the third encapsulation film 373 may be in a range of 6 μm to 12 μm, the thickness of the first encapsulation film 371 may be in a range of 1 μm to 2 μm, and the thickness of the second encapsulation film 372 may be in a range of 0.5 μm to 1 μm. Since the thickness of the third encapsulation film 373 is much greater than the thickness of each of the first encapsulation film 371 and the second encapsulation film 372, the thickness of the encapsulation layer 37 is mainly determined by the thickness of the third encapsulation film 373. In order to make the encapsulation layer 37 have a high light transmittance, the thickness of the encapsulation layer 37 should be reduced as much as possible under a condition that the encapsulation effect is ensured and the process level is realizable, thereby reducing the energy consumption of the display panel. For example, the thickness of the third encapsulation film 373 may be, for example, 6 μm, the thickness of the first encapsulation film 371 is 1 μm, and the thickness of the second encapsulation film 372 is 0.7 μm.

For example, a refractive index of the first encapsulation film 371, a refractive index of the second encapsulation film 372, and a refractive index of the third encapsulation film 373 may be different. The refractive index of the first encapsulation film 371 is in a range of 1.5 to 1.8, the refractive index of the second encapsulation film 372 is in a range of 1.8 to 2, and the refractive index of the third encapsulation film 373 is in a range of 1.45 to 1.65. For example, the refractive index of the first encapsulation film 371 is 1.78, the refractive index of the second encapsulation film 372 is 1.9, and the refractive index of the third encapsulation film 373 is 1.65. It will be understood that light is refracted when passing through the encapsulation layer 37. That is, an orthographic projection of an incident point of the light entering the encapsulation layer 37 on the substrate 30 does not coincide with an orthographic projection of an exit point of the light leaving the encapsulation layer 37 on the substrate 30. A distance between the orthographic projection of the incident point on the substrate 30 and the orthographic projection of the exit point on the substrate 30 is referred to as a refraction displacement. In a case where the thickness of each film layer in the encapsulation layer 37 is constant, the higher the refractive index of the encapsulation layer 37, the lower the refraction displacement. Since the thickness of the first encapsulation film 371 and the thickness of the second encapsulation film 372 are much less than the thickness of the third encapsulation film 373, refraction displacements generated in the first encapsulation film 371 and the second encapsulation film 372 may be ignored, and the refraction displacement of the light passing through the encapsulation layer 37 is mainly determined by the refractive index of the third encapsulation film 373. The higher the refractive index of the third encapsulation film 373, the lower the refraction displacement of the light passing through the encapsulation layer 37, so that the exit point of the light is able to be prevented from being located in a region where the light-shielding layer 31 is located, and more exit points of the light passing through the encapsulation layer 37 are distributed in the opening portions 310. Therefore, on a premise of not increasing the energy consumption, the display effect of the display panel is improved due to a high luminance of the light.

For example, since the encapsulation layer 37 has a certain thickness, and the thickness of the encapsulation layer 37 affects the refraction displacement of the light emitted from the sub-pixel P passing through the opening portion 310. In a case where the refractive index is constant, the greater the thickness of the encapsulation layer 37, the greater the refraction displacement, which causes more light to be absorbed by the light-shielding layer 31, so that the luminance of the light emitted from the first color sub-pixel P1, the luminance of the light emitted from the second color sub-pixel P2, and the luminance of the light emitted from the third color sub-pixel P3 are reduced. Based on this, in a case where the light-shielding layer 31 is disposed on the side surface of the encapsulation layer 37 away from the substrate 30, accordingly, the material of the encapsulation layer 37 with a high refractive index may be selected, and/or the thickness of the encapsulation layer 37 may be reduced. Moreover, the length of the first opening portion 3101, he length of the second opening portion 3102 and he length of the third opening portion 3103 in the above embodiments are increased. That is, an aperture ratio of the first opening portion 3101, an aperture ratio of the second opening portion 3102, and an aperture ratio of the third opening portion 3103 are increased, so as to compensate for a luminance reduction of the light emitted from the sub-pixel P due to an increased refraction displacement when passing through the encapsulation layer 37.

Figure 16:
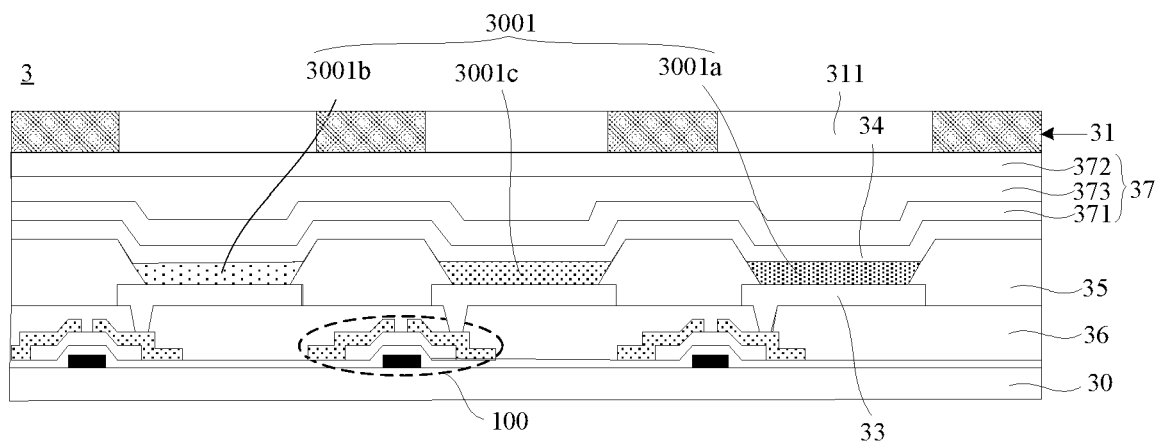
FIG. 16 is a structural diagram of yet another display panel, in accordance with embodiments of the present disclosure.

In some embodiments, as shown in FIG. 16, the light-shielding layer 31 further includes transparent patterns 311 that are respectively filled in the opening portions 310.

Figure 17:
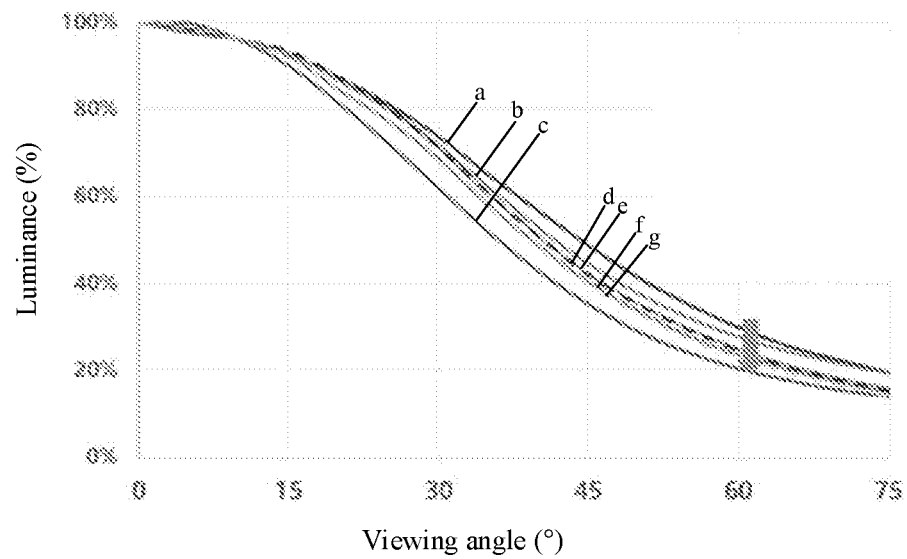
FIG. 17 is a simulation diagram showing luminance decay rates of sub-pixels, in accordance with embodiments of the present disclosure.

Since the light-shielding layer 31 in the embodiments of the present disclosure further includes the transparent patterns 311 that are respectively filled in the opening portions 310, the light-shielding layer 31 may be planarized, and thus the display panel 3 is planarized. As shown in FIG. 17, as the viewing angle increases, a luminance decay curve of the red sub-pixel (i.e, c curve), a luminance decay curve of the green sub-pixel (i.e., b curve) and a luminance decay curve of the blue sub-pixel (i.e., a curve) are plotted. It is apparent from FIG. 17 that as the viewing angle increases, the luminance decay rate of the red sub-pixel, the luminance decay rate of the green sub-pixel and the luminance decay rate of the blue sub-pixel are inconsistent. FIG. 17 also illustrates that considering the green sub-pixel as an example, a curve of the luminance decay rate of the green sub-pixel with the increase of the viewing angle is changed by adjusting the dimension of the opening portion corresponding to the green sub-pixel. It can be seen from FIG. 17 that in a case where the light-shielding layer 31 is not included in the display panel 3, a curve of the luminance decay rate of the green sub-pixel with the increase of the viewing angle is the b curve, and in a case where the display panel 3 includes the light-shielding layer 31, curves (i.e., d, e, f and g curves) of the luminance decay rates of the green sub-pixels with the increase of the viewing angle are significantly changed.

Referring to FIG. 17 again, the d curve in FIG. 17 represents a curve of the luminance decay rate of the green sub-pixel in a case where the light-shielding layer 31 is made of the light-absorbing material, the length of the sub-pixel P is 80 μm, and the length of the opening portion 310 is 90 μm. The e curve represents a curve of the luminance decay rate of the green sub-pixel in a case where the light-shielding layer 31 is made of the metal material, the length of the sub-pixel P is 80 μm, and the length of the opening portion 310 is 90 μm. The f curve represents a curve of the luminance decay rate of the green sub-pixel in a case where the light-shielding layer 31 is made of the metal material, the length of the sub-pixel P is 80 μm, and the length of the opening portion 310 is 80 μm. The g curve represents a curve of the luminance decay rate of the green sub-pixel in a case where the light-shielding layer 31 is made of the light-absorbing material, the length of the sub-pixel P is 80 μm, and the length of the opening portion 310 is 80 μm. It can be seen that in the case where the light-shielding layer 31 is made of the metal material or the light-absorbing material, the luminance decay rate of the green sub-pixel may be changed by changing the length of the opening portion 310 of the light-shielding layer 31 corresponding to the green sub-pixel. Accordingly, the length of the opening portion 310 of the light-shielding layer 31 corresponding to the red sub-pixel and the length of the opening portion 310 of the light-shielding layer 31 corresponding to the blue sub-pixel are changed, so that the luminance decay rate of the red sub-pixel, the luminance decay rate of the green sub-pixel, and the luminance decay rate of the blue sub-pixel are close to each other to improve the color shift at the large viewing angle.

Figure 18:
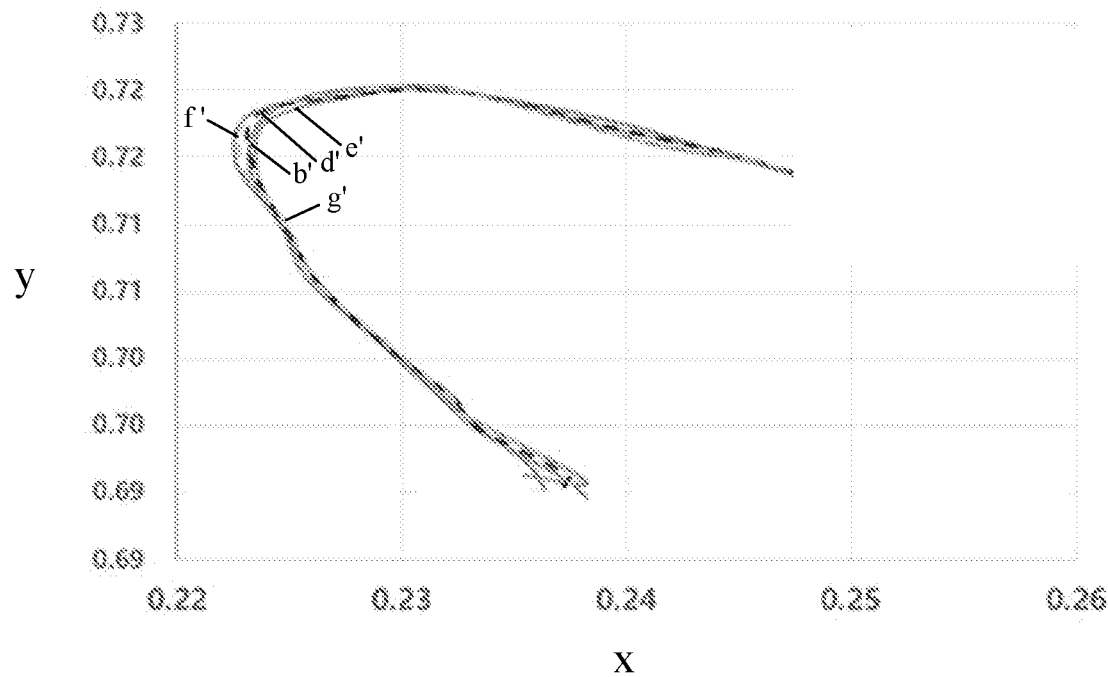
FIG. 18 is a CIExy chromaticity diagram showing simulated spectral curves of light emitted from sub-pixels, in accordance with embodiments of the present disclosure.

As shown in FIG. 18, FIG. 18 is a CIExy chromaticity diagram, considering the green sub-pixel as an example. The d' curve represents a spectral curve of the green sub-pixel in the case where the light-shielding layer 31 is made of the light-absorbing material, the length of the sub-pixel P is 80 μm, and the length of the opening portion 310 is 90 μm. The e' curve represents a spectral curve of the green sub-pixel in the case where the light-shielding layer 31 is made of the metal material, the length of the sub-pixel P is 80 μm, and the length of the opening portion 310 is 90 μm. The f' curve represents a spectral curve of the green sub-pixel in the case where the light-shielding layer 31 is made of the metal material, the length of the sub-pixel P is 80 μm, and the length of the opening portion 310 is 80 μm. The g' curve represents a spectral curve of the green sub-pixel in the case where the light-shielding layer 31 is made of the light-absorbing material, the length of the sub-pixel P is 80 μm, and the length of the opening portion 310 is 80 μm. It can be seen that in a case where the display panel 3 includes the light-shielding layer 31, the light-shielding layer 31 is made of the metal material or the light-absorbing material, and the opening portion 310 corresponding to the green sub-pixels has different dimensions, the spectral curves are similar to a spectral curve (i.e., the b' curve) of the green sub-pixel in the chromaticity diagram in the case where the light-shielding layer 31 is not included in the display panel 3. Therefore, it can be concluded that in the embodiments of the present disclosure, in a case where the light-shielding layer 31 is disposed on the side of the sub-pixels P away from the substrate 30, the light-shielding layer 31 includes the plurality of opening portions 310, and the opening portion 310 corresponds to the sub-pixel P, a change of the spectrum of the light emitted from the sub-pixel P is very small (almost no change). That is, a change of a color depth of the light emitted from the sub-pixel P is very small. Therefore, on a premise that the color shift at the large viewing angle is able to be improved in the embodiments of the present disclosure, the spectrum of the light emitted from the sub-pixel P is not affected, thereby improving a chromaticity uniformity of the display panel 3.

Figure 19:
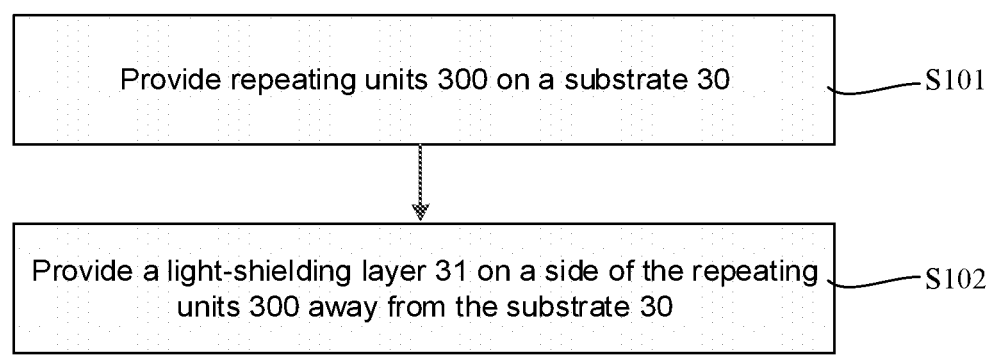
FIG. 19 is a flow diagram of a manufacturing method of a display panel, in accordance with embodiments of the present disclosure.
Figure 20:
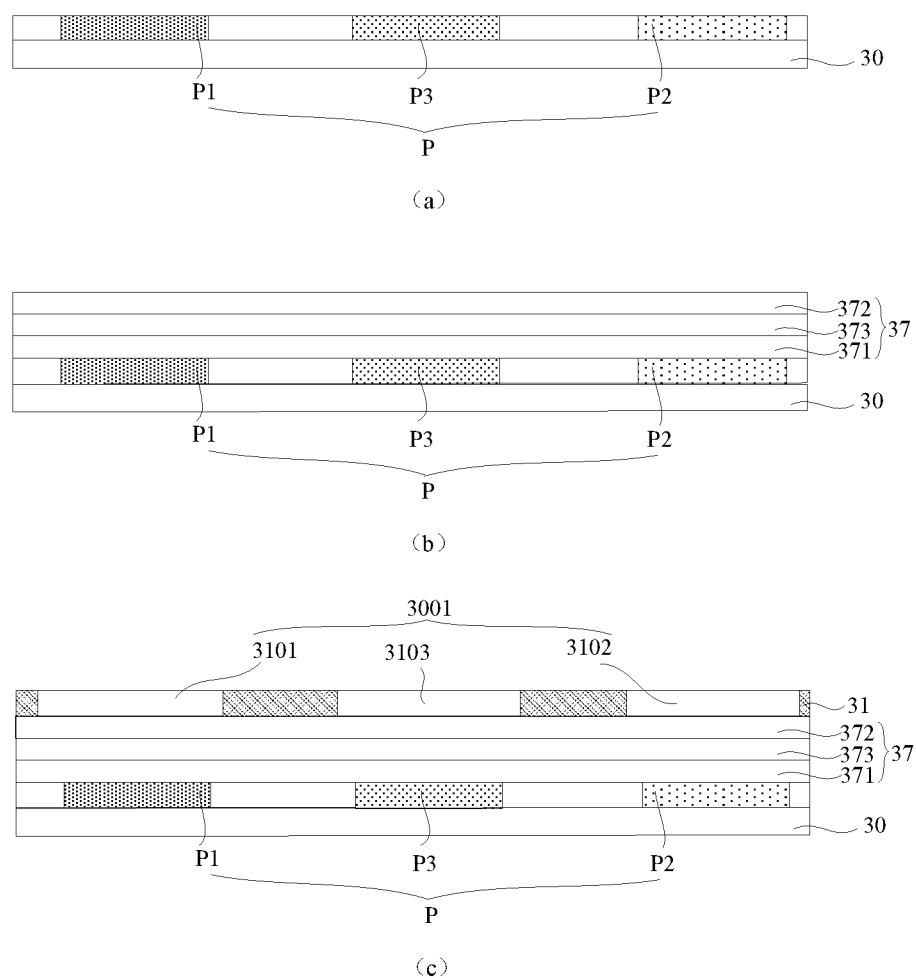
FIG. 20 is a process flow diagram of a manufacturing method of a display panel, in accordance with embodiments of the present disclosure.

Some other embodiments of the present disclosure provide a manufacturing method of a display panel. Referring to FIGS. 19 and 20, the manufacturing method includes S101 and S102.

In S101, repeating units 300 are provided on a substrate 30.

Referring to (a) of FIG. 20, at least two repeating units 300 arranged in an array are disposed on the substrate 30. Each repeating unit 300 includes sub-pixels P, and the sub-pixels P include a first color sub-pixel P1 and a second color sub-pixel P2. As the viewing angle increases, a luminance decay rate of the first color sub-pixel P1 is greater than a luminance decay rate of the second color sub-pixel P2.

Referring to (a) of FIG. 20 again, the repeating unit 300 may further include a third color sub-pixel P3. A luminance decay rate of the third sub-pixel P3 is less than the luminance decay rate of the first color sub-pixel P1, and is greater than the luminance decay rate of the second color sub-pixel P2.

For example, after the repeating units 300 are formed, the manufacturing method may further include: forming an encapsulation layer 37 on a side of the repeating units 300 away from the substrate 30 to seal the sub-pixels P in the repeating units 300, so as to prevent the sub-pixels P from being damaged by water vapor, and avoid adversely affecting the product life. The number of encapsulation film(s) included in the encapsulation layer 37 is not limited. The encapsulation layer 37 may include an encapsulation film, or the encapsulation layer 37 may include two or more encapsulation films that are stacked. For example, the encapsulation layer 37 includes three encapsulation films that are stacked in sequence. For example, referring to (b) of FIG. 20, the three encapsulation films are a first encapsulation film 371, a second encapsulation film 372, and a third encapsulation film 373 disposed between the first encapsulation film 371 and the second encapsulation film 372, respectively. The third encapsulation film 373 is made of an organic material, and the first encapsulation film 371 and the second encapsulation film 372 are each made of an inorganic material.

In S102, a light-shielding layer 31 is provided on the side of the repeating units 300 away from the substrate 30.

In combination with the above embodiments, due to different materials of the sub-pixels and different microcavity environments where the sub-pixels are respectively located, luminance decay curves of the sub-pixels P in each device with the increase of the viewing angle are inconsistent. Therefore, after the encapsulation layer 37 is formed, referring to (c) of FIG. 20, the luminance decay curves of the sub-pixels P of different colors in the display device with the increase of the viewing angle may be measured first. Then, a length of a corresponding opening portion 310 is adjusted according to the measurement results. Finally, a mask required for manufacturing the light-shielding layer 31 is manufactured to form the light-shielding layer 31 required by the device. The light-shielding layer 31 may be made of a light-absorbing material or a metal material, which is not limited in the embodiments of the present disclosure. The light-shielding layer 31 includes a plurality of opening portions 310. In a thickness direction of the substrate 30, a sub-pixel P corresponds to an opening portion 310, and each opening portion 310 exposes at least one portion of the sub-pixel P corresponding to the opening portion 310. An orthographic projection of a light-emitting portion 3001 on the substrate 30 is located within an orthogonal projection of an opening portion 310 corresponding to the light-emitting portion 3001 on the substrate 30. The plurality of opening portions 310 include first opening portions 3101 respectively corresponding to first color sub-pixel P1 in the repeating units 300, and second opening portion 3102 respectively corresponding to second color sub-pixel P2 in the repeating units 300. Along a first direction, a difference between a length of the first opening portion 3101 and a length of a portion of the first color sub-pixel P1 exposed from the first opening portion 3101 is greater than a difference between a length of the second opening portion 3102 and a length of a portion of the second color sub-pixel P2 exposed from the second opening portion 3102. The first direction is a horizontal direction or a vertical direction.

For example, in a case where the repeating unit 300 further includes a third color sub-pixel P3, the plurality of opening portions 310 further include third opening portion 3103 respectively corresponding to third color sub-pixel P3 in the repeating units 300. Along the first direction, a difference between a length of the third opening portion 3103 and a length of a portion of the third color sub-pixel P3 exposed from the third opening portion 3103 is less than the difference between the length of the first opening portion 3101 and the length of the portion of the first color sub-pixel P1 exposed from the first opening portion 3101, and is greater than the difference between the length of the second opening portion 3102 and the length of the portion of the second color sub-pixel P2 exposed from the second opening portion 3102.

For example, in a case where the light-shielding layer 31 is made of the metal material, a method of forming the light-shielding layer 31 may be, for example, magnetron sputter. The magnetron sputter requires a short time for manufacturing the light-shielding layer 31, and is able to save material, which is beneficial to controlling and optimize the production cost.

Materials and shapes of the film layers and positional relationships between the film layers in the display panel manufactured by the above manufacturing method may refer to the above embodiments of the display panel, and same technical effects may be produced, which will not be repeated here.

The foregoing descriptions are merely specific implementation manners of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A display panel, comprising:
   a substrate;
   at least two repeating units disposed on the substrate and arranged in an array, wherein each repeating unit includes a plurality of sub-pixels, and the plurality of sub-pixels include a first color sub-pixel and a second color sub-pixel; and as a viewing angle increases, a luminance decay rate of the first color sub-pixel is greater than a luminance decay rate of the second color sub-pixel; and
   a light-shielding layer disposed on a side of the at least two repeating units away from the substrate, wherein the light-shielding layer includes a plurality of opening portions, and in a thickness direction of the substrate, a sub-pixel in the plurality of sub-pixels corresponds to an opening portion in the plurality of opening portions; and the opening portion exposes at least one portion of the sub-pixel corresponding to the opening portion; wherein
   the plurality of opening portions include first opening portions respectively corresponding to first color sub-pixels in the at least two repeating units, and second opening portions respectively corresponding to second color sub-pixels in the at least two repeating units; along a first direction, a difference between a length of a first opening portion in the first opening portions corresponding to the first color sub-pixel and a length of a portion of the first color sub-pixel exposed from the first opening portion is greater than a difference between a length of a second opening portion in the second opening portions corresponding to the second color sub-pixel and a length of a portion of the second color sub-pixel exposed from the second opening portion; and the first direction is a horizontal direction or a vertical direction;
   wherein an orthographic projection of the sub-pixel on the substrate is located within an orthogonal projection of the opening portion corresponding to the sub-pixel on the substrate;
   wherein a boundary of the orthogonal projection of the opening portion on the substrate and a boundary of the orthographic projection of the sub-pixel on the substrate have a loop-shaped gap therebetween;
   wherein the boundary of the orthographic projection of the sub-pixel on the substrate has a first edge and a second edge that are parallel to each other;
   the loop-shaped gap includes a first sub-gap and a second sub-gap; the first sub-gap is a gap between the first edge and a corresponding edge of the boundary of the orthogonal projection of the opening portion on the substrate, and the second sub-gap is a gap between the second edge and a corresponding edge of the boundary of the orthogonal projection of the opening portion on the substrate; and
   the first sub-gap and the second sub-gap have a same width at all positions;
   wherein the light-shielding layer is made of a light-absorbing material having a thickness D1, and D1 is greater than or equal to 0.1 μm and less than or equal to 1.5 μm;
   or
   the light-shielding layer is made of a metal material having a thickness D2, and D2 is greater than or equal to 10 nm and less than or equal to 1000 nm.

2. The display panel according to claim 1, wherein a ratio of a first opening length to a first light-emitting length is greater than a ratio of a second opening length to a second light-emitting length, wherein the first opening length is the length of the first opening portion along the first direction, and the first light-emitting length is the length of the portion of the first color sub-pixel exposed from the first opening portion along the first direction; the second opening length is the length of the second opening portion along the first direction, and the second light-emitting length is the length of the portion of the second color sub-pixel exposed from the second opening portion along the first direction.

3. The display panel according to claim 2, wherein along a second direction, a difference between a length of the first opening portion and a length of the portion of the first color sub-pixel exposed from the first opening portion is greater than a difference between a length of the second opening portion and a length of the portion of the second color sub-pixel exposed from the second opening portion; and the second direction is perpendicular to the first direction.

4. The display panel according to claim 1, wherein along a second direction, a difference between a length of the first opening portion and a length of the portion of the first color sub-pixel exposed from the first opening portion is greater than a difference between a length of the second opening portion and a length of the portion of the second color sub-pixel exposed from the second opening portion; and the second direction is perpendicular to the first direction.

5. The display panel according to claim 4, wherein a ratio of a third opening length to a third light-emitting length is greater than a ratio of a fourth opening length to a fourth light-emitting length, wherein the third opening length is the length of the first opening portion along the second direction, and the third light-emitting length is the length of the portion of the first color sub-pixel exposed from the first opening portion along the second direction; the fourth opening length is the length of the second opening portion along the second direction, and the fourth light-emitting length is the length of the portion of the second color sub-pixel exposed from the second opening portion along the second direction.

6. The display panel according to claim 1, wherein the plurality of sub-pixels further include a third color sub-pixel; and a luminance decay rate of the third color sub-pixel is less than the luminance decay rate of the first color sub-pixel, and is greater than the luminance decay rate of the second color sub-pixel; and the plurality of opening portions further include third opening portions respectively corresponding to third color sub-pixels in the at least two repeating units; along the first direction, a difference between a length of a third opening portion in the third opening portions corresponding to the third color sub-pixel and a length of a portion of the third color sub-pixel exposed from the third opening portion is less than the difference between the length of the first opening portion and the length of the portion of the first color sub-pixel exposed from the first opening portion, and is greater than the difference between the length of the second opening portion and the length of the portion of the second color sub-pixel exposed from the second opening portion.

7. The display panel according to claim 6, wherein a ratio of a fifth opening length to a fifth light-emitting length is less than a ratio of a first opening length to a first light-emitting length, and is greater than a ratio of a second opening length to a second light-emitting length; wherein the first opening length is the length of the first opening portion along the first direction, and the first light-emitting length is the length of the portion of the first color sub-pixel exposed from the first opening portion along the first direction; the second opening length is the length of the second opening portion along the first direction, and the second light-emitting length is the length of the portion of the second color sub-pixel exposed from the second opening portion along the first direction; the fifth opening length is the length of the third opening portion along the first direction, and the fifth light-emitting length is the length of the portion of the third color sub-pixel exposed from the third opening portion along the first direction.

8. The display panel according to claim 6, wherein along a second direction, a difference between a length of the first opening portion and a length of the portion of the first color sub-pixel exposed from the first opening portion is greater than a difference between a length of the second opening portion and a length of the portion of the second color sub-pixel exposed from the second opening portion; and the second direction is perpendicular to the first direction; and a ratio of a sixth opening length to a sixth light-emitting length is less than a ratio of a third opening length to a third light-emitting length, and is greater than a ratio of a fourth opening length to a fourth light-emitting length; wherein the third opening length is the length of the first opening portion along the second direction, and the third light-emitting length is the length of the portion of the first color sub-pixel exposed from the first opening portion along the second direction; the fourth opening length is the length of the second opening portion along the second direction, and the fourth light-emitting length is the length of the portion of the second color sub-pixel exposed from the second opening portion along the second direction; the sixth opening length is a length of the third opening portion along the second direction, and the sixth light-emitting length is a length of the portion of the third color sub-pixel exposed from the third opening portion along the second direction.

9. The display panel according to claim 1, wherein the light-shielding layer further includes transparent patterns that are respectively filled in the plurality of opening portions.

10. The display panel according to claim 1, wherein each sub-pixel includes a light-emitting portion.

11. The display panel according to claim 1, further comprising:
an encapsulation layer, the light-shielding layer being disposed on a side of the encapsulation layer away from the substrate.

12. The display panel according to claim 11, wherein the encapsulation layer includes a first encapsulation film, a second encapsulation film, and a third encapsulation film disposed between the first encapsulation film and the second encapsulation film; wherein a thickness of the third encapsulation film is greater than a thickness of each of the first encapsulation film and the second encapsulation film.

13. The display panel according to claim 12, wherein the thickness of the third encapsulation film is in a range of 6 μm to 12 μm, and a refractive index of the third encapsulation film is in a range of 1.45 to 1.65.

14. A display device, comprising the display panel according to claim 1.

15. A manufacturing method of a display panel, comprising:
- providing at least two repeating units arranged in an array on a substrate, wherein each repeating unit includes a plurality of sub-pixels, and the plurality of sub-pixels include a first color sub-pixel and a second color sub-pixel; and as a viewing angle increases, a luminance decay rate of the first color sub-pixel is greater than a luminance decay rate of the second color sub-pixel; and
- providing a light-shielding layer on a side of the at least two repeating units away from the substrate, wherein the light-shielding layer includes a plurality of opening portions, and in a thickness direction of the substrate, a sub-pixel in the plurality of sub-pixels corresponds to an opening portion in the plurality of opening portions; and the opening portion exposes at least one portion of the sub-pixel corresponding to the opening portion; wherein
- the plurality of opening portions include first opening portions respectively corresponding to first color sub-pixels in the at least two repeating units, and second opening portions respectively corresponding to second color sub-pixels in the at least two repeating units; along a first direction, a difference between a length of a first opening portion in the first opening portions corresponding to the first color sub-pixel and a length of a portion of the first color sub-pixel exposed from the first opening portion is greater than a difference between a length of a second opening portion in the second opening portions corresponding to the second color sub-pixel and a length of a portion of the second color sub-pixel exposed from the second opening portion; and the first direction is a horizontal direction or a vertical direction;
- wherein an orthographic projection of the sub-pixel on the substrate is located within an orthogonal projection of the opening portion corresponding to the sub-pixel on the substrate;
- wherein a boundary of the orthogonal projection of the opening portion on the substrate and a boundary of the orthographic projection of the sub-pixel on the substrate have a loop-shaped gap therebetween;
- wherein the boundary of the orthographic projection of the sub-pixel on the substrate has a first edge and a second edge that are parallel to each other;
- the loop-shaped gap includes a first sub-gap and a second sub-gap; the first sub-gap is a gap between the first edge and a corresponding edge of the boundary of the orthogonal projection of the opening portion on the substrate, and the second sub-gap is a gap between the second edge and a corresponding edge of the boundary of the orthogonal projection of the opening portion on the substrate; and
- the first sub-gap and the second sub-gap have a same width at all positions;
- wherein the light-shielding layer is made of a light-absorbing material having a thickness D1, and D1 is greater than or equal to 0.1 µm and less than or equal to 1.5 µm;
- or
- the light-shielding layer is made of a metal material having a thickness D2, and D2 is greater than or equal to 10 nm and less than or equal to 1000 nm.

16. The manufacturing method of the display panel according to claim 15, wherein providing the light-shielding layer on the side of the at least two repeating units away from the substrate, includes:
- forming the light-shielding layer on the side of the at least two repeating units away from the substrate through magnetron sputter.

* * * * *